(12) United States Patent
Okuda et al.

(10) Patent No.: US 10,147,699 B2
(45) Date of Patent: Dec. 4, 2018

(54) PRESSURE CONTACT TYPE SEMICONDUCTOR APPARATUS

(71) Applicant: Mitsubishi Electric Corporation, Chiyoda-ku (JP)

(72) Inventors: Satoshi Okuda, Chiyoda-ku (JP); Akihiko Furukawa, Chiyoda-ku (JP); Tomohiro Ikeda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/559,676

(22) PCT Filed: Mar. 25, 2016

(86) PCT No.: PCT/JP2016/059693
§ 371 (c)(1),
(2) Date: Sep. 19, 2017

(87) PCT Pub. No.: WO2016/189953
PCT Pub. Date: Dec. 1, 2016

(65) Prior Publication Data
US 2018/0277508 A1    Sep. 27, 2018

(30) Foreign Application Priority Data

May 26, 2015   (JP) .................................. 2015-106475

(51) Int. Cl.
*H01L 23/00*  (2006.01)
*H01L 25/18*  (2006.01)
(Continued)

(52) U.S. Cl.
CPC .............. *H01L 24/72* (2013.01); *H01L 23/04* (2013.01); *H01L 23/10* (2013.01); *H01L 25/18* (2013.01);
(Continued)

(58) Field of Classification Search
CPC ......... H01L 23/58; H01L 23/62; H01L 25/16; H01L 25/165; H01L 25/18; H01L 24/72;
(Continued)

(56) References Cited

U.S. PATENT DOCUMENTS 3,975,758 A * 8/1976 Schlegel ............... H01L 23/051
257/689
4,958,215 A * 9/1990 Kojima ................. H01L 23/051
257/182

(Continued)

FOREIGN PATENT DOCUMENTS

JP    8-88240 A    4/1996
JP    10-93085 A    4/1998

(Continued)

OTHER PUBLICATIONS

International Search Report dated Jun. 7, 2016, in PCT/JP2016/059693 filed Mar. 25, 2016.

*Primary Examiner* — Scott B Geyer
(74) *Attorney, Agent, or Firm* — Oblon, McClelland, Maier & Neustadt, L.L.P.

(57) ABSTRACT

In a pressure contact type semiconductor apparatus, a second intermediate electrode on a second semiconductor chip has one or more second through holes. The one or more second through holes are fluidly separated from a space hermetically sealed by a cylindrical body, a first common electrode plate and a second common electrode plate. The pressure contact type semiconductor apparatus thereby has high reliability.

19 Claims, 14 Drawing Sheets

(51) Int. Cl.
  *H01L 23/04* (2006.01)
  *H01L 23/10* (2006.01)
  *H01L 23/40* (2006.01)

(52) U.S. Cl.
  CPC ...... *H01L 23/40* (2013.01); *H01L 2924/1203* (2013.01); *H01L 2924/13055* (2013.01)

(58) Field of Classification Search
  CPC ....... H01L 24/26; H01L 23/04; H01L 23/043; H01L 23/051; H01L 23/10
  See application file for complete search history.

(56) References Cited

U.S. PATENT DOCUMENTS

| | | | |
|---|---|---|---|
| 5,610,439 A | 3/1997 | Hiyoshi et al. | |
| 5,705,853 A * | 1/1998 | Faller | H01L 24/72 257/177 |
| 6,087,682 A * | 7/2000 | Ando | H01L 24/72 257/177 |
| 6,181,007 B1 * | 1/2001 | Yamazaki | H01L 23/051 257/718 |
| 6,426,561 B1 * | 7/2002 | Lang | H01L 23/051 257/678 |
| 7,538,436 B2 * | 5/2009 | Gunturi | H01L 23/051 257/773 |
| 7,547,966 B2 * | 6/2009 | Funakoshi | H01L 23/051 257/706 |
| 2011/0062600 A1 | 3/2011 | Ueno et al. | |

FOREIGN PATENT DOCUMENTS

| | | |
|---|---|---|
| JP | 11-187642 A | 7/1999 |
| JP | 2001-230373 A | 8/2001 |
| JP | 3256636 B2 | 2/2002 |
| JP | 2004-311699 A | 11/2004 |
| JP | 2009-267246 A | 11/2009 |
| JP | 2015-26667 A | 2/2015 |
| WO | WO 2009/101685 A1 | 8/2009 |

* cited by examiner

PRESSURE CONTACT TYPE SEMICONDUCTOR APPARATUS

TECHNICAL FIELD

The present disclosure relates to pressure contact type semiconductor apparatuses.

BACKGROUND ART

A pressure contact type semiconductor apparatus including a pressure contact type semiconductor device is known as a device for converting or controlling a large amount of electric power (see PTD 1). There is also known a pressure contact type semiconductor apparatus having a stack structure in which a plurality of pressure contact type semiconductor devices and a plurality of heat dissipation members are alternately stacked (see PTD 2 and PTD 3).

A pressure contact type semiconductor device includes a first semiconductor chip with three terminals such as an insulated gate bipolar transistor (IGBT), and a second semiconductor chip with two terminals such as a flywheel diode. The second semiconductor chip is electrically connected in parallel to the first semiconductor chip. The second semiconductor chip electrically protects the first semiconductor chip, for example. A plurality of intermediate electrodes serving as buffer plates are disposed on a main surface of the first semiconductor chip and a main surface of the second semiconductor chip. A first common electrode plate is disposed on the plurality of intermediate electrodes. A second common electrode plate is disposed on a backside surface of the first semiconductor chip and a backside surface of the second semiconductor chip. By pressing the first common electrode plate and the second common electrode plate toward the first semiconductor chip and the second semiconductor chip, the first semiconductor chip and the second semiconductor chip are electrically connected to an external power supply.

CITATION LIST

Patent Documents

PTD 1: Japanese Patent Laying-Open No. 8-88240
PTD 2: Japanese Patent Laying-Open No. 10-93085
PTD 3: Japanese Patent Laying-Open No. 11-187642

SUMMARY OF INVENTION

Technical Problem

An intermediate electrode transfers heat generated at a second semiconductor chip during operation of a pressure contact type semiconductor apparatus to a first common electrode plate. Thus, an outer edge of the second semiconductor chip that is not in contact with the intermediate electrode has a higher temperature than that of a region of the second semiconductor chip that is in contact with the intermediate electrode. When an overcurrent flows through the second semiconductor chip, the temperature of the outer edge of the second semiconductor chip increases significantly, which may result in selective damage to the outer edge of the second semiconductor chip, causing fragments of the second semiconductor chip to scatter around the second semiconductor chip. The fragments of the second semiconductor chip cause damage to a first semiconductor chip and a package that houses the first semiconductor chip and the second semiconductor chip. This may result in inability of the pressure contact type semiconductor apparatus to convert and control electric power.

The present disclosure has been made in view of the aforementioned problem, and an object of the present disclosure is to provide a pressure contact type semiconductor apparatus having high reliability.

Solution to Problem

In a pressure contact type semiconductor apparatus of present disclosure, a second intermediate electrode on a second semiconductor chip has one or more second through holes. The one or more second through holes are fluidly separated from a space hermetically sealed by a cylindrical body, a first common electrode plate and a second common electrode plate.

Advantageous Effects of Invention

In a pressure contact type semiconductor apparatus of the present disclosure, a second intermediate electrode has one or more second through holes. The one or more second through holes are fluidly separated from a space hermetically sealed by a cylindrical body, a first common electrode plate and a second common electrode plate. Thus, fragments of a second semiconductor chip are trapped in the one or more second through holes. The fragments of the second semiconductor chip are prevented from causing damage to a first semiconductor chip and a package that houses the first semiconductor chip and the second semiconductor chip. The pressure contact type semiconductor apparatus of the present disclosure can continue to convert and control electric power, and has high reliability.

DESCRIPTION OF EMBODIMENTS

Figure 1:
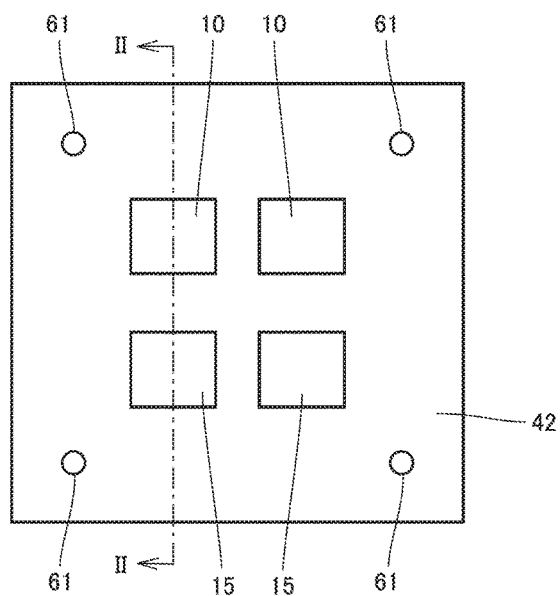
FIG. 1 is a schematic plan view of a pressure contact type semiconductor apparatus according to a first embodiment of the present disclosure.

Embodiments of the present disclosure will be described below. The same components are designated by the same reference numerals and description thereof will not be repeated.

First Embodiment

With reference to FIGS. 1 to 7, a pressure contact type semiconductor apparatus 1 of a first embodiment is described. Pressure contact type semiconductor apparatus 1 of the present embodiment includes a pressure contact type semiconductor device 2 and a pressing portion 6.

Pressure contact type semiconductor device 2 mainly includes a first semiconductor chip 10, a second semiconductor chip 15, a first common electrode plate 40, a first intermediate electrode 20, a second intermediate electrode 25, a second common electrode plate 45, and a cylindrical body 50. Pressure contact type semiconductor device 2 may further include a first connection member 30 and a second connection member 35.

First semiconductor chip 10 is a semiconductor device with three terminals. First semiconductor chip 10 may be a semiconductor switching element. Examples of the semiconductor switching element include a transistor such as an insulated gate bipolar transistor (IGBT) or a metal-oxide-semiconductor field-effect transistor (MOSFET), and a thyristor such as a gate turnoff (GTO) thyristor. In the present embodiment, first semiconductor chip 10 is an insulated gate bipolar transistor (IGBT). First semiconductor chip 10 has a first electrode 11, a second electrode 12 and a third electrode 13. First electrode 11 is provided on a surface of first semiconductor chip 10. First electrode 11 may be an emitter electrode. Second electrode 12 is provided on a backside surface of first semiconductor chip 10 opposite to the surface of first semiconductor chip 10. Second electrode 12 may be a collector electrode. Third electrode 13 is electrically isolated from first electrode 11 and provided on the surface of first semiconductor chip 10. Third electrode 13 is disposed on the outer side of first intermediate electrode 20. Third electrode 13 may be a gate electrode.

Second semiconductor chip 15 is a semiconductor device with two terminals. Second semiconductor chip 15 may be an element providing rectification. In the present embodiment, second semiconductor chip 15 is a diode such as a flywheel diode. Second semiconductor chip 15 has a fourth electrode 16 and a fifth electrode 17. Fourth electrode 16 is provided on a surface of second semiconductor chip 15. Fifth electrode 17 is provided on a backside surface of second semiconductor chip 15 opposite to the surface of second semiconductor chip 15. Second semiconductor chip 15 is electrically connected in parallel to first semiconductor chip 10. More particularly, second semiconductor chip 15 is electrically connected in anti-parallel to first semiconductor chip 10. Fourth electrode 16 may be a cathode electrode, and fifth electrode 17 may be an anode electrode. Second semiconductor chip 15 may bypass a surge current generated when first semiconductor chip 10 is turned off, to prevent the surge current from flowing to first semiconductor chip 10. Second semiconductor chip 15 may electrically protect first semiconductor chip 10.

With reference to FIG. 1, pressure contact type semiconductor device 2 of the present embodiment includes two first semiconductor chips 10 and two second semiconductor chips 15. The number of first semiconductor chips 10 included in pressure contact type semiconductor device 2 is not limited to two. The number of second semiconductor chips 15 included in pressure contact type semiconductor device 2 is not limited to two. Examples of a base material for first semiconductor chip 10 and second semiconductor chip 15 include a semiconductor material such as silicon (Si), silicon carbide (SiC), gallium nitride (GaN), gallium oxide ($Ga_2O_3$), or diamond.

First intermediate electrode 20 is disposed on first electrode 11 of first semiconductor chip 10. First intermediate electrode 20 may be a conductive metal block. First intermediate electrode 20 is electrically connected to first electrode 11 of first semiconductor chip 10. First intermediate electrode 20 has a first surface 21 facing first electrode 11 of first semiconductor chip 10, and a second surface 22 opposite to first surface 21. Second surface 22 of first intermediate electrode 20 may face first connection member 30. Third electrode 13 may be disposed on the outer side of first intermediate electrode 20.

Figure 2:
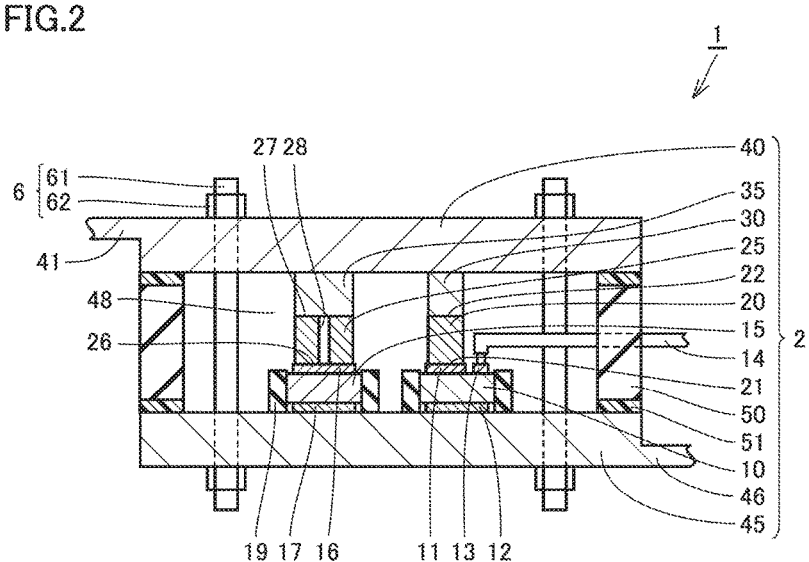
FIG. 2 is a schematic cross-sectional view, along the cross-sectional line ll-ll shown in FIG. 1, of the pressure contact type semiconductor apparatus according to the first embodiment of the present disclosure.
Figure 3:
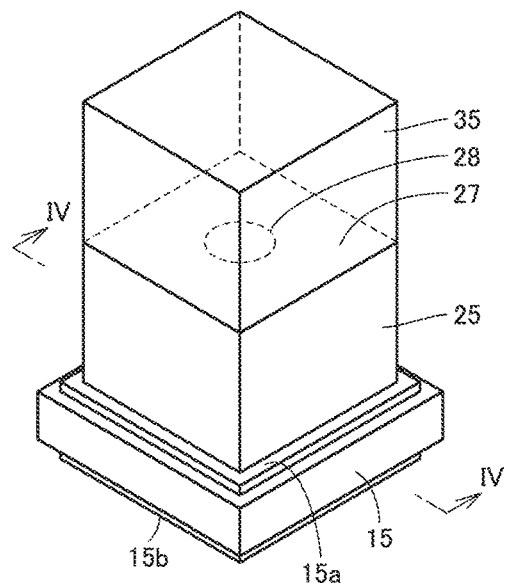
FIG. 3 is a schematic partial enlarged perspective view of a second semiconductor chip, a second intermediate electrode and a second connection member in the pressure contact type semiconductor apparatus according to the first embodiment of the present disclosure.
Figure 4:
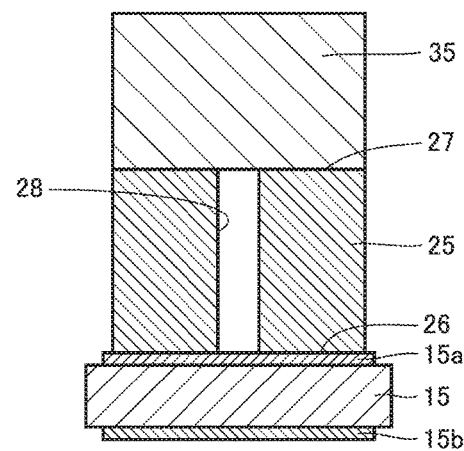
FIG. 4 is a schematic partial enlarged cross-sectional view, along the cross-sectional line IV-IV shown in FIG. 3, of the pressure contact type semiconductor apparatus according to the first embodiment of the present disclosure.
Figure 7:
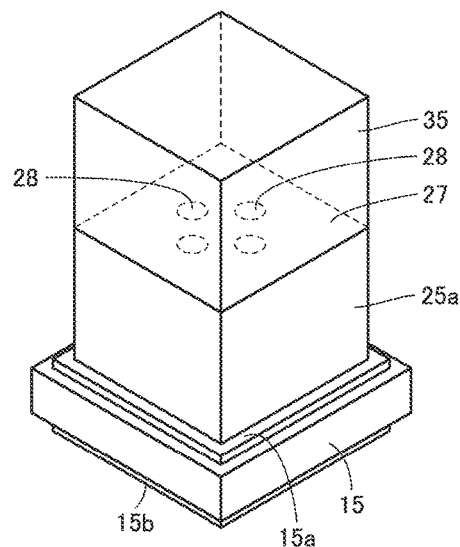
FIG. 7 is a schematic partial enlarged perspective view of a second semiconductor chip, a second intermediate electrode and a second connection member in the pressure contact type semiconductor apparatus according to the variation of the first embodiment of the present disclosure.

Second intermediate electrode 25 is disposed on fourth electrode 16 of second semiconductor chip 15. Second intermediate electrode 25 may be a conductive metal block. Second intermediate electrode 25 is electrically connected to fourth electrode 16 of second semiconductor chip 15. Second intermediate electrode 25 has a third surface 26 facing fourth electrode 16 of second semiconductor chip 15, and a fourth surface 27 opposite to third surface 26. Fourth surface 27 of second intermediate electrode 25 may face second connection member 35. Second intermediate electrode 25 has one or more second through holes 28 extending between third surface 26 and fourth surface 27. As shown in FIGS. 2 and 3, in the present embodiment, second intermediate electrode 25 may have one second through hole 28. As shown in FIG. 7, in one variation of the present embodiment, second intermediate electrode 25 may have a plurality of second through holes 28. One or more second through holes 28 may be circular (see FIGS. 3 and 7), or have another shape such as a quadrangular shape.

One or more second through holes 28 are fluidly separated from a space 48 hermetically sealed by cylindrical body 50, first common electrode plate 40 and second common electrode plate 45. One or more second through holes 28 are not communicated with space 48 hermetically sealed by cylindrical body 50, first common electrode plate 40 and second common electrode plate 45. More particularly, second connection member 35 and second semiconductor chip 15 close one or more second through holes 28. More particularly, second connection member 35 and fourth electrode 16 of second semiconductor chip 15 close one or more second through holes 28.

A difference in thermal expansion coefficient between first intermediate electrode 20 and first semiconductor chip 10 is preferably small. A difference in thermal expansion coefficient between second intermediate electrode 25 and second semiconductor chip 15 is preferably small. If first semiconductor chip 10 and second semiconductor chip 15 are made of silicon, then first intermediate electrode 20 and second intermediate electrode 25 may be made of molybdenum (Mo) or tungsten (W).

First connection member 30 is disposed on first intermediate electrode 20. First connection member 30 is disposed between first intermediate electrode 20 and first common electrode plate 40. First connection member 30 may be a conductive metal block. First connection member 30 is electrically connected to first intermediate electrode 20 and first common electrode plate 40. First connection member 30 may have good thermal conductivity. First connection member 30 may be made of copper (Cu), for example.

Second connection member 35 is disposed on second intermediate electrode 25. Second connection member 35 is disposed between second intermediate electrode 25 and first common electrode plate 40. Second connection member 35 may be a conductive metal block. Second connection member 35 may be electrically connected to second intermediate electrode 25 and first common electrode plate 40. Second connection member 35 may have good thermal conductivity. Second connection member 35 may be made of copper (Cu), for example.

First common electrode plate 40 and second common electrode plate 45 sandwich first semiconductor chip 10, second semiconductor chip 15, first intermediate electrode 20 and second intermediate electrode 25 therebetween. First common electrode plate 40 and second common electrode plate 45 may further sandwich first connection member 30 and second connection member 35 therebetween. First common electrode plate 40 may be disposed on first connection member 30 and second connection member 35. First semiconductor chip 10 and second semiconductor chip 15 are placed on second common electrode plate 45. First semiconductor chip 10 and second semiconductor chip 15 may be fixed onto second common electrode plate 45 by solder. Second common electrode plate 45 is electrically connected to second electrode 12 of first semiconductor chip 10 and fifth electrode 17 of second semiconductor chip 15. First semiconductor chip 10 and second semiconductor chip 15 are electrically connected in parallel to each other by first common electrode plate 40 and second common electrode plate 45.

First common electrode plate 40 has a first terminal 41. Second common electrode plate 45 has a second terminal 46. Electric power is supplied through first terminal 41 and second terminal 46 to first semiconductor chip 10 and second semiconductor chip 15 from the outside of pressure contact type semiconductor apparatus 1. Examples of first common electrode plate 40 and second common electrode plate 45 include a copper plate. First common electrode plate 40 and second common electrode plate 45 are pressed by pressing portion 6 toward first semiconductor chip 10 and second semiconductor chip 15, to be electrically connected to first semiconductor chip 10 and second semiconductor chip 15.

A guide 19 may be provided on second common electrode plate 45. Guide 19 positions first semiconductor chip 10 and second semiconductor chip 15. Guide 19 may be electrically insulating. Guide 19 may be made of Teflon® or silicone resin.

Figure 5:
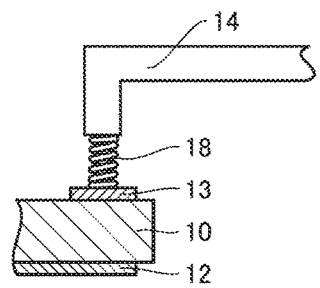
FIG. 5 is a schematic partial enlarged view of a first semiconductor chip and a third terminal in the pressure contact type semiconductor apparatus according to the first embodiment of the present disclosure.
Figure 6:
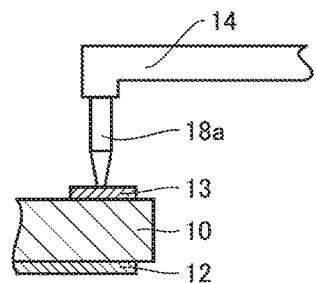
FIG. 6 is a schematic partial enlarged view of a first semiconductor chip and a third terminal in a pressure contact type semiconductor apparatus according to a variation of the first embodiment of the present disclosure.

Pressure contact type semiconductor device 2 of the present embodiment may further include a third terminal 14 that supplies at least one of current and voltage to third electrode 13 of first semiconductor chip 10. Third terminal 14 is fixed to cylindrical body 50. Third terminal 14 is electrically connected to third electrode 13. Third terminal 14 may be electrically connected to third electrode 13 with a conductive first elastic member (18, 18a) interposed therebetween. As shown in FIG. 5, conductive first elastic member 18 may be a conductive spring. As shown in FIG. 6, conductive first elastic member 18a may be a conductive spring pin having a spring therein. Third terminal 14 is connected to a drive circuit (not shown) provided outside of cylindrical body 50.

Cylindrical body 50 is mechanically connected to first common electrode plate 40 and second common electrode plate 45 with a sealing member 51 interposed therebetween. Cylindrical body 50, first common electrode plate 40 and second common electrode plate 45 hermetically seal first semiconductor chip 10, second semiconductor chip 15, first intermediate electrode 20 and second intermediate electrode 25. Cylindrical body 50, first common electrode plate 40 and second common electrode plate 45 may further hermetically seal first connection member 30 and second connection member 35. First semiconductor chip 10, second semiconductor chip 15, first intermediate electrode 20 and second intermediate electrode 25 are disposed within space 48 hermetically sealed by cylindrical body 50, first common electrode plate 40 and second common electrode plate 45. First connection member 30 and second connection member 35 may also be disposed within space 48 hermetically sealed by cylindrical body 50, first common electrode plate 40 and second common electrode plate 45. Cylindrical body 50, first common electrode plate 40 and second common electrode plate 45 form a package of pressure contact type semiconductor device 2. Cylindrical body 50 is made of an insulating material. Examples of the material used for cylindrical body 50 include resin such as polyphenylene sulfide (PPS) resin, or ceramic.

Pressing portion 6 includes a rod 61 and a nut 62. Rod 61 is passed through a hole provided in first common electrode plate 40 and a hole provided in second common electrode plate 45. Opposite ends of rod 61 are threaded bolts (not shown). Pressing portion 6 presses first common electrode plate 40 and second common electrode plate 45 toward first semiconductor chip 10 and second semiconductor chip 15. Specifically, nut 62 is tightened on the bolt of rod 61 to press first common electrode plate 40 and second common electrode plate 45 toward first semiconductor chip 10 and second semiconductor chip 15. In this manner, first common electrode plate 40 and second common electrode plate 45 are electrically connected to first semiconductor chip 10 and second semiconductor chip 15. Pressing portion 6 may include other pressing means.

The effect of pressure contact type semiconductor apparatus 1 of the present embodiment will be described.

Pressure contact type semiconductor apparatus 1 of the present embodiment includes pressure contact type semiconductor device 2, and pressing portion 6 that presses pressure contact type semiconductor device 2. Pressure contact type semiconductor device 2 includes first semiconductor chip 10 with three terminals, second semiconductor chip 15 with two terminals, first intermediate electrode 20, second intermediate electrode 25, first common electrode plate 40, second common electrode plate 45 and cylindrical body 50. First semiconductor chip 10 has first electrode 11, second electrode 12 and third electrode 13. Second semiconductor chip 15 has fourth electrode 16 and fifth electrode 17. First intermediate electrode 20 is disposed on first electrode 11 of first semiconductor chip 10. Second intermediate electrode 25 is disposed on fourth electrode 16 of second semiconductor chip 15. First common electrode plate 40 and second common electrode plate 45 sandwich first semiconductor chip 10, second semiconductor chip 15, first intermediate electrode 20 and second intermediate electrode 25 therebetween. Cylindrical body 50 is mechanically connected to first common electrode plate 40 and second common electrode plate 45. Cylindrical body 50, first common electrode plate 40 and second common electrode plate 45 hermetically seal first semiconductor chip 10, second semiconductor chip 15, first intermediate electrode 20 and second intermediate electrode 25. First common electrode plate 40 and second common electrode plate 45 are pressed by pressing portion 6 toward first semiconductor chip 10 and second semiconductor chip 15, to be electrically connected to first semiconductor chip 10 and second semiconductor chip 15. Second semiconductor chip 15 is electrically connected in parallel to first semiconductor chip 10. First intermediate electrode 20 has first surface 21 facing first electrode 11 of first semiconductor chip 10, and second surface 22 opposite to first surface 21. Second intermediate electrode 25 has third surface 26 facing fourth electrode 16 of second semiconductor chip 15, and fourth surface 27 opposite to third surface 26. Second intermediate electrode 25 has one or more second through holes 28 extending between third surface 26 and fourth surface 27. One or more second through holes 28 are fluidly separated from space 48 hermetically sealed by cylindrical body 50, first common electrode plate 40 and second common electrode plate 45.

Second intermediate electrode 25 has one or more second through holes 28 extending between third surface 26 and fourth surface 27. Second intermediate electrode 25 transfers heat generated at second semiconductor chip 15 during operation of pressure contact type semiconductor apparatus 1 to first common electrode plate 40. Due to this heat, a region of second semiconductor chip 15 that corresponds to one or more second through holes 28 has a higher temperature than that of the other region of second semiconductor chip 15. Even if an overcurrent flows through second semiconductor chip 15 to result in damage to second semiconductor chip 15, the site of the damage in second semiconductor chip 15 is limited to the region of second semiconductor chip 15 that corresponds to one or more second through holes 28. In the present embodiment, one or more second through holes 28 are fluidly separated from space 48 hermetically sealed by cylindrical body 50, first common electrode plate 40 and second common electrode plate 45. Thus, even if the region of second semiconductor chip 15 that corresponds to one or more second through holes 28 is damaged, fragments of second semiconductor chip 15 are prevented from causing damage to first semiconductor chip 10 and the package that houses first semiconductor chip 10 and second semiconductor chip 15. Pressure contact type semiconductor apparatus 1 of the present embodiment can continue to convert and control electric power, and has high reliability.

Pressure contact type semiconductor apparatus 1 of the present embodiment further includes second connection member 35 between second intermediate electrode 25 and first common electrode plate 40. Second connection member 35 and second semiconductor chip 15 close one or more second through holes 28. Thus, even if the region of second semiconductor chip 15 that corresponds to one or more second through holes 28 is damaged, fragments of second semiconductor chip 15 are trapped in one or more second through holes 28. The fragments of second semiconductor chip 15 are prevented from causing damage to first semiconductor chip 10 and the package that houses first semiconductor chip 10 and second semiconductor chip 15. Pressure contact type semiconductor apparatus 1 of the present embodiment can continue to convert and control electric power, and has high reliability.

Second Embodiment

Figure 8:
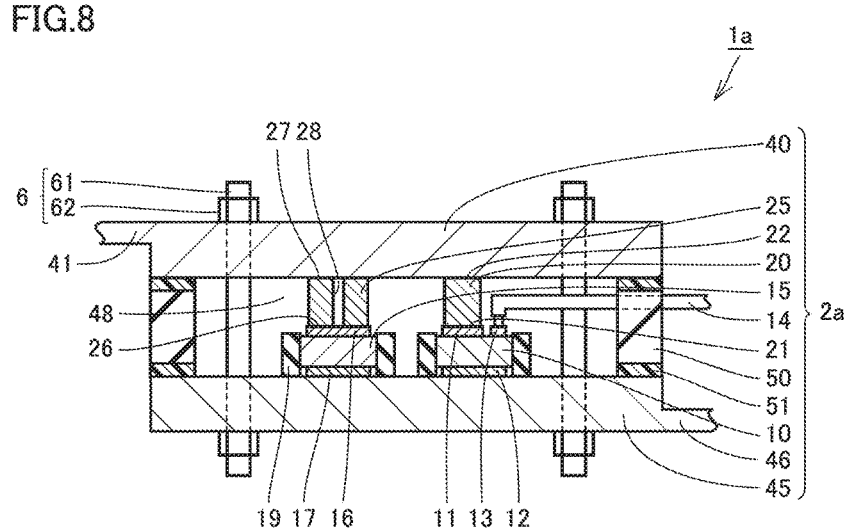
FIG. 8 is a schematic cross-sectional view of a pressure contact type semiconductor apparatus according to a second embodiment of the present disclosure.

With reference to FIG. 8, a pressure contact type semiconductor apparatus 1a according to a second embodiment is described. Pressure contact type semiconductor apparatus 1a of the present embodiment basically has a similar configuration to that of pressure contact type semiconductor apparatus 1 of the first embodiment, but mainly differs in the following respects.

Pressure contact type semiconductor apparatus 1a of the present embodiment includes a pressure contact type semiconductor device 2a. Pressure contact type semiconductor device 2a of the present embodiment does not include first connection member 30 and second connection member 35 (see FIG. 2). First common electrode plate 40 and second semiconductor chip 15 close one or more second through holes 28. More particularly, first common electrode plate 40 and fourth electrode 16 of second semiconductor chip 15 close one or more second through holes 28.

The effect of pressure contact type semiconductor apparatus 1a of the present embodiment will be described. Pressure contact type semiconductor apparatus 1a of the present embodiment produces a similar effect to that of pressure contact type semiconductor apparatus 1 of the first embodiment, but differs in the following respects.

In pressure contact type semiconductor apparatus 1a of the present embodiment, first common electrode plate 40 and second semiconductor chip 15 close one or more second through holes 28. Thus, even if the region of second semiconductor chip 15 that corresponds to one or more second through holes 28 is damaged, fragments of second semiconductor chip 15 are trapped in one or more second through holes 28. The fragments of second semiconductor chip 15 are prevented from causing damage to first semiconductor chip 10 and the package that houses first semiconductor chip 10 and second semiconductor chip 15. Pressure contact type semiconductor apparatus 1a of the present embodiment can continue to convert and control electric power, and has high reliability.

Pressure contact type semiconductor apparatus 1a of the present embodiment does not include first connection member 30 and second connection member 35 (see FIG. 2). Accordingly, pressure contact type semiconductor apparatus 1a of the present embodiment has a smaller number of components and a simpler structure than those of pressure contact type semiconductor apparatus 1 of the first embodiment.

Third Embodiment

With reference to FIGS. 9 to 12, a pressure contact type semiconductor apparatus 1b according to a third embodiment is described. Pressure contact type semiconductor apparatus 1b of the present embodiment basically has a similar configuration to that of pressure contact type semiconductor apparatus 1 of the first embodiment, but mainly differs in the following respects.

Figure 9:
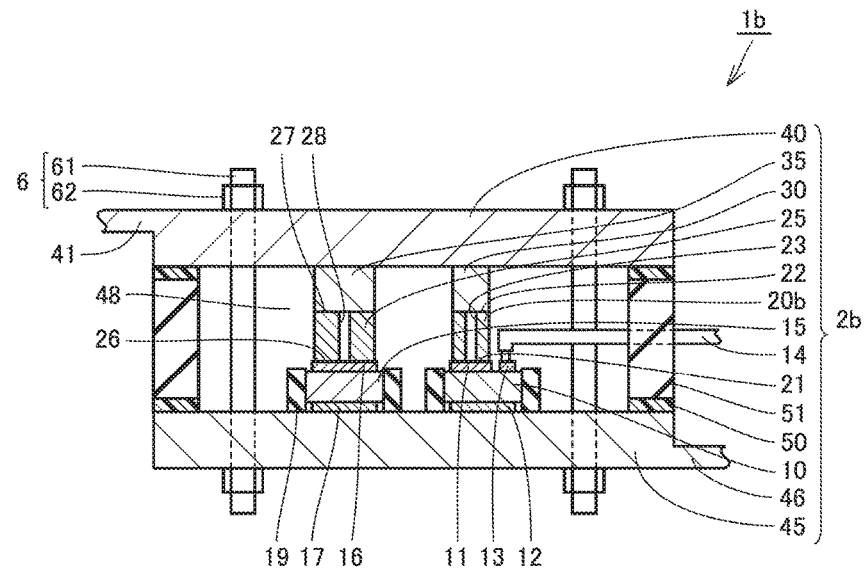
FIG. 9 is a schematic cross-sectional view of a pressure contact type semiconductor apparatus according to a third embodiment of the present disclosure.
Figure 10:
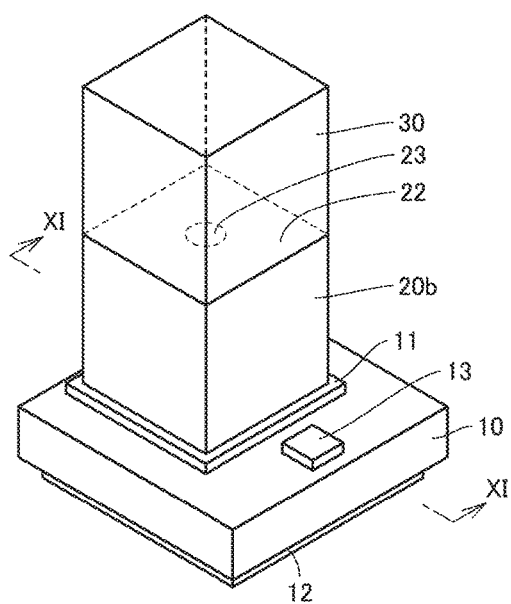
FIG. 10 is a schematic partial enlarged perspective view of a first semiconductor chip, a first intermediate electrode and a first connection member in the pressure contact type semiconductor apparatus according to the third embodiment of the present disclosure.
Figure 11:
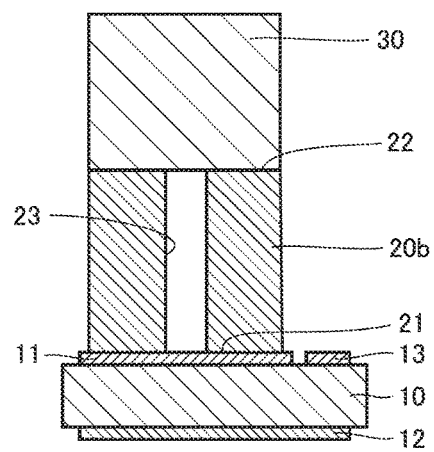
FIG. 11 is a schematic partial enlarged cross-sectional view, along the cross-sectional line XI-XI shown in FIG. 10, of the pressure contact type semiconductor apparatus according to the third embodiment of the present disclosure.
Figure 12:
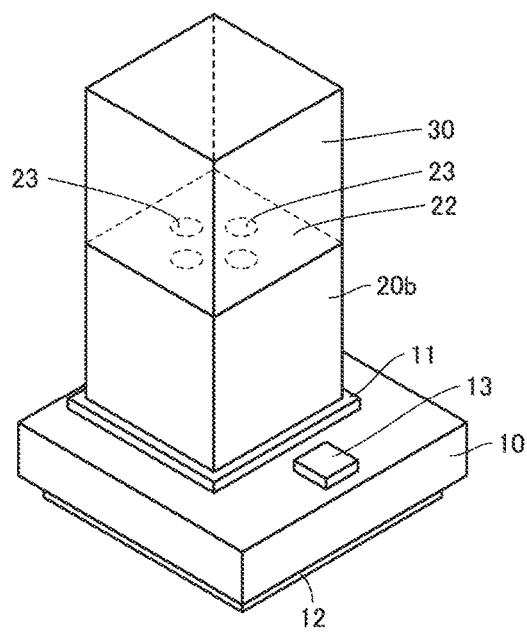
FIG. 12 is a schematic partial enlarged perspective view of a first semiconductor chip, a first intermediate electrode and a first connection member in a pressure contact type semiconductor apparatus according to a variation of the third embodiment of the present disclosure.

Pressure contact type semiconductor apparatus 1b of the present embodiment includes a pressure contact type semiconductor device 2b. Pressure contact type semiconductor device 2b of the present embodiment includes a first intermediate electrode 20b. First intermediate electrode 20b has one or more first through holes 23 extending between first surface 21 and second surface 22. As shown in FIGS. 9 and 10, in the present embodiment, first intermediate electrode 20b may have one first through hole 23. As shown in FIG. 12, in one variation of the present embodiment, first intermediate electrode 20b may have a plurality of first through holes 23. One or more first through holes 23 may be circular (see FIGS. 10 and 12), or have another shape such as a quadrangular shape. One or more first through holes 23 are fluidly separated from space 48 hermetically sealed by cylindrical body 50, first common electrode plate 40 and second common electrode plate 45. One or more first through holes 23 are not communicated with space 48 hermetically sealed by cylindrical body 50, first common electrode plate 40 and second common electrode plate 45.

Pressure contact type semiconductor device 2b of the present embodiment further includes first connection member 30 between first intermediate electrode 20b and first common electrode plate 40. First connection member 30 and first semiconductor chip 10 close one or more first through holes 23. More particularly, first connection member 30 and first electrode 11 of first semiconductor chip 10 close one or more first through holes 23.

In the present embodiment, third electrode 13 of first semiconductor chip 10 is disposed on the outer side of first intermediate electrode 20b and one or more first through holes 23.

The effect of pressure contact type semiconductor apparatus 1b of the present embodiment will be described. In addition to the effect of pressure contact type semiconductor apparatus 1 of the first embodiment, pressure contact type semiconductor apparatus 1b of the present embodiment produces the following effect.

First intermediate electrode 20b of the present embodiment has one or more first through holes 23 extending between first surface 21 and second surface 22. First intermediate electrode 20b transfers heat generated at first semiconductor chip 10 during operation of pressure contact type semiconductor apparatus 1b to first common electrode plate 40. Due to this heat, a region of first semiconductor chip 10 that corresponds to one or more first through holes 23 has a higher temperature than that of the other region of first semiconductor chip 10. Even if an overcurrent flows through first semiconductor chip 10 to result in damage to first semiconductor chip 10, the site of the damage in first semiconductor chip 10 is limited to the region of first semiconductor chip 10 that corresponds to one or more first through holes 23. In the present embodiment, one or more first through holes 23 are fluidly separated from space 48 hermetically sealed by cylindrical body 50, first common electrode plate 40 and second common electrode plate 45. Thus, even if the region of first semiconductor chip 10 that corresponds to one or more first through holes 23 is damaged, fragments of first semiconductor chip 10 are prevented from causing damage to second semiconductor chip 15 and the package that houses first semiconductor chip 10 and second semiconductor chip 15. Pressure contact type semiconductor apparatus 1b of the present embodiment can continue to convert and control electric power, and has high reliability.

Pressure contact type semiconductor apparatus 1b of the present embodiment further includes first connection member 30 between first intermediate electrode 20b and first common electrode plate 40. First connection member 30 and first semiconductor chip 10 close one or more first through holes 23. Thus, even if the region of first semiconductor chip 10 that corresponds to one or more first through holes 23 is damaged, fragments of first semiconductor chip 10 are trapped in one or more first through holes 23. The fragments of first semiconductor chip 10 are prevented from causing damage to second semiconductor chip 15 and the package that houses first semiconductor chip 10 and second semiconductor chip 15. Pressure contact type semiconductor apparatus 1b of the present embodiment can continue to convert and control electric power, and has high reliability.

In pressure contact type semiconductor apparatus 1b of the present embodiment, third electrode 13 is disposed on the outer side of first intermediate electrode 20b and one or more first through holes 23. The ratio of the area occupied by first electrode 11 in first through hole 23 can thereby increased. Accordingly, during operation of pressure contact type semiconductor apparatus 1b, the region of first semiconductor chip 10 that corresponds to one or more first through holes 23 tends to have a higher temperature than that of the other region of first semiconductor chip 10. The possibility of damage to the outer edge of first semiconductor chip 10 is reduced. The site of the damage in first semiconductor chip 10 can be more reliably limited to the region of first semiconductor chip 10 that corresponds to one or more first through holes 23. The fragments of first semiconductor chip 10 are more reliably prevented from causing damage to second semiconductor chip 15 and the package that houses first semiconductor chip 10 and second semiconductor chip 15. Pressure contact type semiconductor apparatus 1b of the present embodiment can continue to convert and control electric power, and has higher reliability.

In a pressure contact type semiconductor apparatus of a variation of the present embodiment, first connection member 30 may be omitted as in the second embodiment, and first through hole 23 may be closed by first common electrode plate 40 and first semiconductor chip 10. In a pressure contact type semiconductor apparatus of a variation of the present embodiment, second connection member 35 may be omitted, and second through hole 28 may be closed by first common electrode plate 40 and second semiconductor chip 15, as in the second embodiment.

Fourth Embodiment

Figure 13:
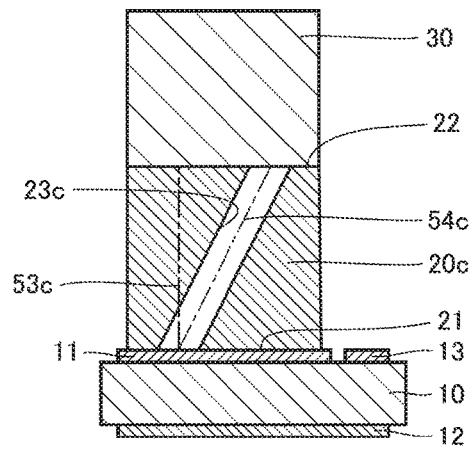
FIG. 13 is a schematic partial enlarged cross-sectional view of a first semiconductor chip, a first intermediate electrode and a first connection member in a pressure contact type semiconductor apparatus according to a fourth embodiment of the present disclosure.
Figure 14:
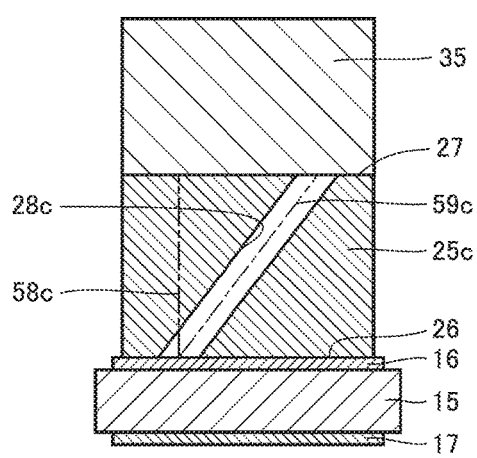
FIG. 14 is a schematic partial enlarged cross-sectional view of a second semiconductor chip, a second intermediate electrode and a second connection member in the pressure contact type semiconductor apparatus according to the fourth embodiment of the present disclosure.

With reference to FIGS. 13 and 14, a pressure contact type semiconductor apparatus according to a fourth embodiment is described. The pressure contact type semiconductor apparatus of the present embodiment basically has a similar configuration to that of pressure contact type semiconductor apparatus 1b of the third embodiment, but mainly differs in the following respects.

A first intermediate electrode 20c of the present embodiment has one or more first through holes 23c. A direction 54c along which one or more first through holes 23c extend is inclined relative to a normal 53c of first electrode 11. A second intermediate electrode 25c of the present embodiment includes one or more second through holes 28c. A direction 59c along which one or more second through holes 28c extend is inclined relative to a normal 58c of second electrode 12.

The effect of the pressure contact type semiconductor apparatus of the present embodiment will be described. In addition to the effect of pressure contact type semiconductor apparatus 1b of the third embodiment, the pressure contact type semiconductor apparatus of the present embodiment produces the following effect.

In the present embodiment, direction 54c along which one or more first through holes 23c extend is inclined relative to normal 53c of first electrode 11. Fragments of first semiconductor chip 10 collide with the inner wall of first intermediate electrode 20c that forms the outer periphery of one or more first through holes 23c. Energy of the fragments of first semiconductor chip 10 is attenuated by the inner wall of first intermediate electrode 20c. The fragments of first semiconductor chip 10 are more reliably prevented from causing damage to second semiconductor chip 15 and the package that houses first semiconductor chip 10 and second semiconductor chip 15. The pressure contact type semiconductor apparatus of the present embodiment can continue to convert and control electric power, and has higher reliability.

In the present embodiment, direction 59c along which one or more second through holes 28c extend is inclined relative to normal 58c of fourth electrode 16. Fragments of second semiconductor chip 15 collide with the inner wall of second intermediate electrode 25c that forms the outer periphery of one or more second through holes 28c. Energy of the fragments of second semiconductor chip 15 is attenuated by the inner wall of second intermediate electrode 25c. The fragments of second semiconductor chip 15 are more reliably prevented from causing damage to first semiconductor chip 10 and the package that houses first semiconductor chip 10 and second semiconductor chip 15. The pressure contact type semiconductor apparatus of the present embodiment can continue to convert and control electric power, and has higher reliability.

In a pressure contact type semiconductor apparatus of a first variation of the present embodiment, second intermediate electrode 25 in pressure contact type semiconductor apparatus 1 of the first embodiment may be replaced by second intermediate electrode 25c of the present embodiment. In a pressure contact type semiconductor apparatus of a second variation of the present embodiment, second intermediate electrode 25 in pressure contact type semiconductor apparatus 1a of the second embodiment may be replaced by second intermediate electrode 25c of the present embodiment. In a third variation of the present embodiment, only first intermediate electrode 20b in pressure contact type semiconductor apparatus 1b of the third embodiment may be replaced by first intermediate electrode 20c of the present embodiment. In a fourth variation of the present embodiment, only second intermediate electrode 25 in pressure contact type semiconductor apparatus 1b of the third embodiment may be replaced by second intermediate electrode 25c of the present embodiment.

Fifth Embodiment

Figure 15:
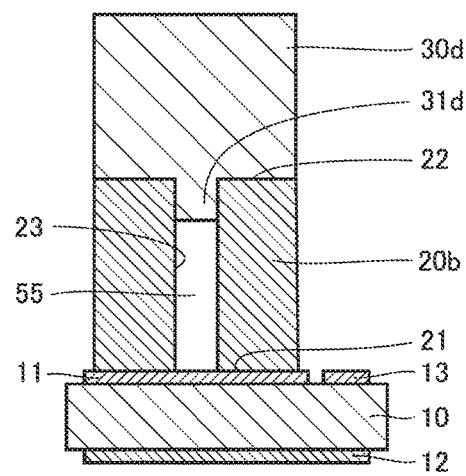
FIG. 15 is a schematic partial enlarged cross-sectional view of a first semiconductor chip, a first intermediate electrode and a first connection member in a pressure contact type semiconductor apparatus according to a fifth embodiment of the present disclosure.
Figure 16:
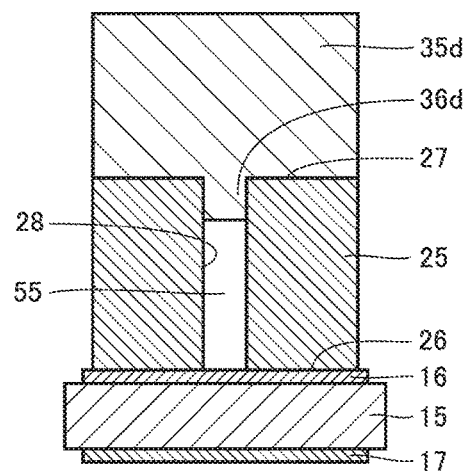
FIG. 16 is a schematic partial enlarged cross-sectional view of a second semiconductor chip, a second intermediate electrode and a second connection member in the pressure contact type semiconductor apparatus according to the fifth embodiment of the present disclosure.

With reference to FIGS. 15 and 16, a pressure contact type semiconductor apparatus according to a fifth embodiment is described. The pressure contact type semiconductor apparatus of the present embodiment basically has a similar configuration to that of pressure contact type semiconductor apparatus 1b of the third embodiment, but mainly differs in the following respects.

A first connection member 30d of the present embodiment has a first projecting portion 31d inserted into at least one of one or more first through holes 23. First projecting portion 31d may be fitted into at least one of one or more first through holes 23.

A second connection member 35d of the present embodiment has a second projecting portion 36d inserted into at least one of one or more second through holes 28. Second projecting portion 36d may be fitted into at least one of one or more second through holes 28.

The effect of the pressure contact type semiconductor apparatus of the present embodiment will be described. In addition to the effect of pressure contact type semiconductor apparatus 1b of the third embodiment, the pressure contact type semiconductor apparatus of the present embodiment produces the following effect.

First connection member 30d of the present embodiment has first projecting portion 31d inserted into at least one of one or more first through holes 23. Portions of first connection member 30d of the present embodiment with which the fragments of first semiconductor chip 10 collide are thicker than portions of first connection member 30 of the third embodiment with which the fragments of first semiconductor chip 10 collide. First projecting portion 31d can prevent the fragments of first semiconductor chip 10 from colliding with first connection member 30d to cause damage to first connection member 30d. The fragments of first semiconductor chip 10 are more reliably prevented from causing damage to second semiconductor chip 15 and the package that houses first semiconductor chip 10 and second semiconductor chip 15. The pressure contact type semiconductor apparatus of the present embodiment can continue to convert and control electric power, and has higher reliability.

Second connection member 35d of the present embodiment has second projecting portion 36d inserted into at least one of one or more second through holes 28. Portions of second connection member 35d of the present embodiment with which the fragments of second semiconductor chip 15 collide are thicker than portions of second connection member 35 of the third embodiment with which the fragments of second semiconductor chip 15 collide. Second projecting portion 36d can prevent the fragments of second semiconductor chip 15 from colliding with second connection member 35d to cause damage to second connection member 35d. The fragments of second semiconductor chip 15 are more reliably prevented from causing damage to first semiconductor chip 10 and the package that houses first semiconductor chip 10 and second semiconductor chip 15. The pressure contact type semiconductor apparatus of the present embodiment can continue to convert and control electric power, and has higher reliability.

In a pressure contact type semiconductor apparatus of a first variation of the present embodiment, second connection member 35 in pressure contact type semiconductor apparatus 1 of the first embodiment may be replaced by second connection member 35d of the present embodiment. In a pressure contact type semiconductor apparatus of a second variation of the present embodiment, second connection member 35 in pressure contact type semiconductor apparatus 1a of the second embodiment may be replaced by second connection member 35d of the present embodiment. In a third variation of the present embodiment, only first connection member 30 in pressure contact type semiconductor apparatus 1b of the third embodiment may be replaced by first connection member 30d of the present embodiment. In a fourth variation of the present embodiment, only second connection member 35 in pressure contact type semiconductor apparatus 1b of the third embodiment may be replaced by second connection member 35d of the present embodiment.

Sixth Embodiment

Figure 17:
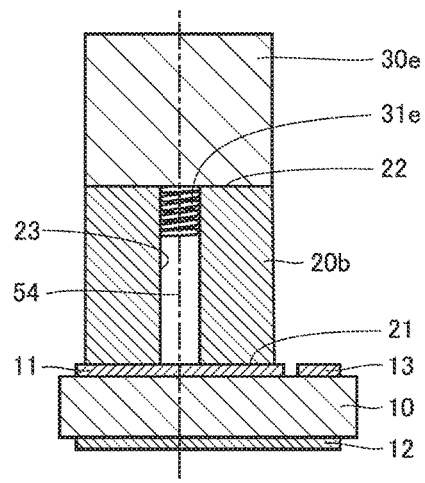
FIG. 17 is a schematic partial enlarged cross-sectional view of a first semiconductor chip, a first intermediate electrode and a first connection member in a pressure contact type semiconductor apparatus according to a sixth embodiment of the present disclosure.
Figure 18:
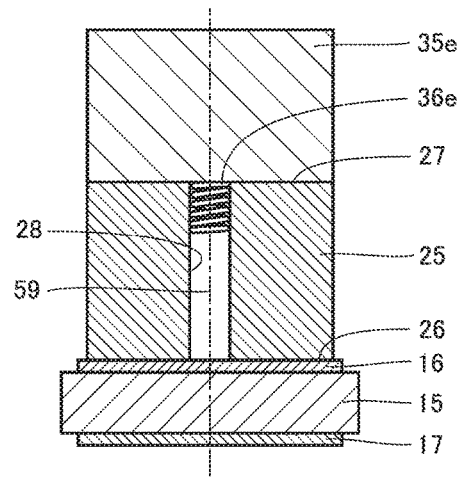
FIG. 18 is a schematic partial enlarged cross-sectional view of a second semiconductor chip, a second intermediate electrode and a second connection member in the pressure contact type semiconductor apparatus according to the sixth embodiment of the present disclosure.

With reference to FIGS. 17 and 18, a pressure contact type semiconductor apparatus according to a sixth embodiment is described. The pressure contact type semiconductor apparatus of the present embodiment basically has a similar configuration to that of pressure contact type semiconductor apparatus 1b of the third embodiment, but mainly differs in the following respects.

A first connection member 30e of the present embodiment has a first elastic portion 31e inserted into at least one of one or more first through holes 23. First elastic portion 31e can expand and contract in a direction 54 along which at least one of one or more first through holes 23 extends. First elastic portion 31e may be a coil spring as shown in FIG. 17. First elastic portion 31e may be a solid body such as rubber. First elastic portion 31e may be fitted into at least one of one or more first through holes 23.

A second connection member 35e of the present embodiment has a second elastic portion 36e inserted into at least one of one or more second through holes 28. Second elastic portion 36e can expand and contract in a direction 59 along which at least one of one or more second through holes 28 extends. Second elastic portion 36e may be a coil spring as shown in FIG. 18. Second elastic portion 36e may be a solid body such as rubber. Second elastic portion 36e may be fitted into at least one of one or more first through holes 23.

The effect of the pressure contact type semiconductor apparatus of the present embodiment will be described. In addition to the effect of pressure contact type semiconductor apparatus 1b of the third embodiment, the pressure contact type semiconductor apparatus of the present embodiment produces the following effect.

First connection member 30e of the present embodiment has first elastic portion 31e inserted into at least one of one or more first through holes 23. First elastic portion 31e can absorb some of the energy of the fragments of first semiconductor chip 10. First elastic portion 31e can prevent the fragments of first semiconductor chip 10 from colliding with first connection member 30e to cause damage to first connection member 30e. The fragments of first semiconductor chip 10 are more reliably prevented from causing damage to second semiconductor chip 15 and the package that houses first semiconductor chip 10 and second semiconductor chip 15. The pressure contact type semiconductor apparatus of the present embodiment can continue to convert and control electric power, and has higher reliability.

Second connection member 35e of the present embodiment has second elastic portion 36e inserted into at least one of one or more second through holes 28. Second elastic portion 36e can absorb some of the energy of the fragments of second semiconductor chip 15. Second elastic portion 36e can prevent the fragments of second semiconductor chip 15 from colliding with second connection member 35e to cause damage to second connection member 35e. The fragments of second semiconductor chip 15 are more reliably prevented from causing damage to first semiconductor chip 10 and the package that houses first semiconductor chip 10 and second semiconductor chip 15. The pressure contact type semiconductor apparatus of the present embodiment can continue to convert and control electric power, and has higher reliability.

In a pressure contact type semiconductor apparatus of a first variation of the present embodiment, second connection member 35 in pressure contact type semiconductor apparatus 1 of the first embodiment may be replaced by second connection member 35e of the present embodiment. In a pressure contact type semiconductor apparatus of a second variation of the present embodiment, second connection member 35 in pressure contact type semiconductor apparatus 1a of the second embodiment may be replaced by second connection member 35e of the present embodiment. In a third variation of the present embodiment, only first connection member 30 in pressure contact type semiconductor apparatus 1b of the third embodiment may be replaced by first connection member 30e of the present embodiment. In a fourth variation of the present embodiment, only second connection member 35 in pressure contact type semiconductor apparatus 1b of the third embodiment may be replaced by second connection member 35e of the present embodiment.

Seventh Embodiment

With reference to FIGS. 19 to 22, a pressure contact type semiconductor apparatus according to a seventh embodiment is described. The pressure contact type semiconductor apparatus of the present embodiment basically has a similar configuration to that of pressure contact type semiconductor apparatus 1b of the third embodiment, but mainly differs in the following respects.

Figure 19:
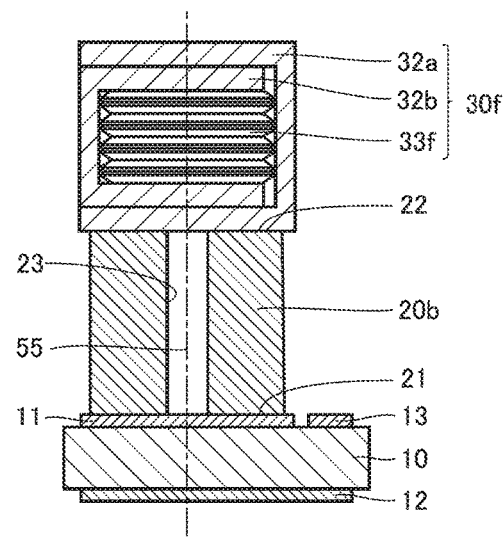
FIG. 19 is a schematic partial enlarged cross-sectional view of a first semiconductor chip, a first intermediate electrode and a first connection member in a pressure contact type semiconductor apparatus according to a seventh embodiment of the present disclosure.
Figure 21:
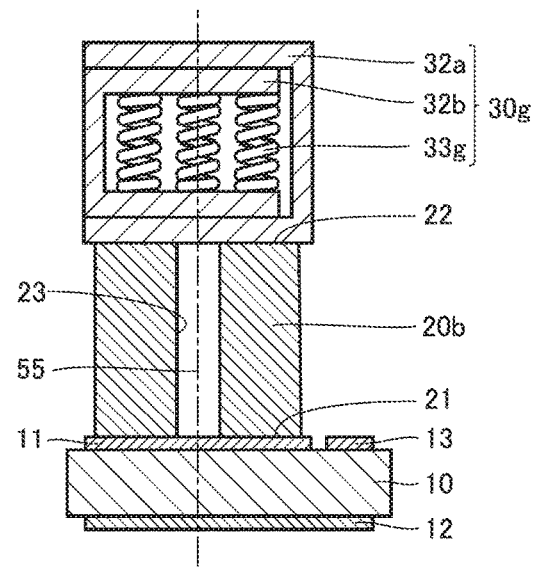
FIG. 21 is a schematic partial enlarged cross-sectional view of a first semiconductor chip, a first intermediate electrode and a first connection member in a pressure contact type semiconductor apparatus according to a variation of the seventh embodiment of the present disclosure.

A first connection member (30f, 30g) of the present embodiment includes a third elastic portion (33f, 33g) that can expand and contract in a pressing direction 55 of pressing portion 6. The third elastic portion (33f, 33g) is located above first intermediate electrode 20b. The third elastic portion (33f, 33g) is disposed between first intermediate electrode 20b and first common electrode plate 40. Specifically, the first connection member (30f, 30g) includes first frames 32a, 32b, and the third elastic portion (33f, 33g). First frames 32a, 32b may be conductive. First frames 32a, 32b may be made of metal. The third elastic portion (33f, 33g) is disposed on the inner side of first frames 32a, 32b. The third elastic portion (33f, 33g) may be sandwiched between portions of first frame 32b. Third elastic portion 33f of first connection member 30f may be a disc spring as shown in FIG. 19. Third elastic portion 33g of first connection member 30g may be a coil spring as shown in FIG. 21.

Figure 20:
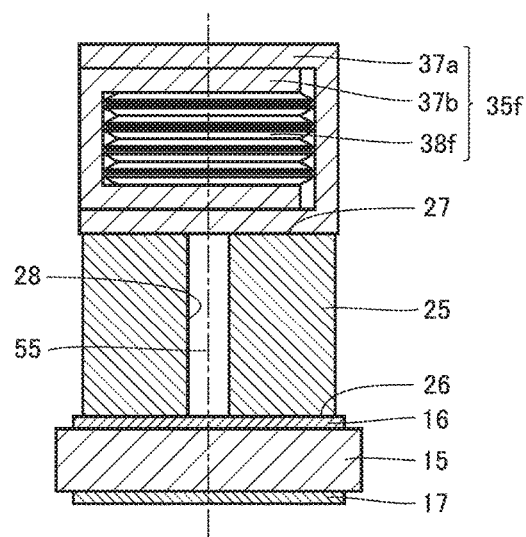
FIG. 20 is a schematic partial enlarged cross-sectional view of a second semiconductor chip, a second intermediate electrode and a second connection member in the pressure contact type semiconductor apparatus according to the seventh embodiment of the present disclosure.
Figure 22:
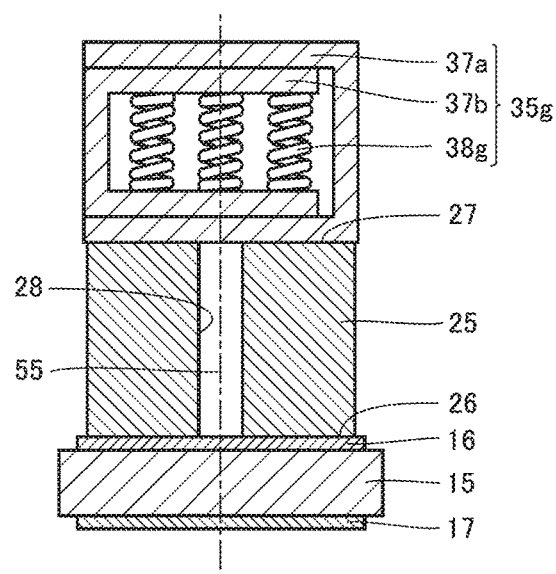
FIG. 22 is a schematic partial enlarged cross-sectional view of a second semiconductor chip, a second intermediate electrode and a second connection member in the pressure contact type semiconductor apparatus according to the variation of the seventh embodiment of the present disclosure.

A second connection member (35f, 35g) of the present embodiment includes a fourth elastic portion (38f, 38g) that can expand and contract in pressing direction 55 of pressing portion 6. The fourth elastic portion (38f, 38g) is located above second intermediate electrode 25. The fourth elastic portion (38f, 38g) is disposed between second intermediate electrode 25 and first common electrode plate 40. Specifically, the second connection member (35f, 35g) includes second frames 37a, 37b, and the fourth elastic portion (38f, 38g). Second frames 37a, 37b may be conductive. Second frames 37a, 37b may be made of metal. The fourth elastic portion (38f, 38g) is disposed on the inner side of second frame 37b. The fourth elastic portion (38f, 38g) may be sandwiched between portions of second frame 37b. Fourth elastic portion 38f of second connection member 35f may be a disc spring as shown in FIG. 20. Fourth elastic portion 38g of second connection member 35g may be a coil spring as shown in FIG. 22.

The effect of the pressure contact type semiconductor apparatus of the present embodiment will be described. In addition to the effect of pressure contact type semiconductor apparatus 1b of the third embodiment, the pressure contact type semiconductor apparatus of the present embodiment produces the following effect.

The first connection member (30f, 30g) of the present embodiment includes the third elastic portion (33f, 33g) that can expand and contract in pressing direction 55 of pressing portion 6. The third elastic portion (33f, 33g) can absorb some of the energy of the fragments of first semiconductor chip 10. The third elastic portion (33f, 33g) can prevent the fragments of first semiconductor chip 10 from colliding with the first connection member (30f, 30g) to cause damage to the first connection member (30f, 30g). The fragments of first semiconductor chip 10 are more reliably prevented from causing damage to second semiconductor chip 15 and the package that houses first semiconductor chip 10 and second semiconductor chip 15. The pressure contact type semiconductor apparatus of the present embodiment can continue to convert and control electric power, and has higher reliability.

The third elastic portion (33f, 33g) is located above first intermediate electrode 20b. The third elastic portion (33f, 33g) can compensate for the difference between the height of first semiconductor chip 10 and first intermediate electrode 20b and the height of second semiconductor chip 15 and second intermediate electrode 25. In this manner, the third elastic portion (33f, 33g) allows the application of uniform pressure to the plurality of semiconductor chips (first semiconductor chip 10 and second semiconductor chip 15) by first common electrode plate 40 and second common electrode plate 45. The third elastic portion (33f, 33g) can prevent the application of high pressure to a portion of the plurality of semiconductor chips (first semiconductor chip 10 and second semiconductor chip 15) to cause damage to the portion of the plurality of semiconductor chips (first semiconductor chip 10 and second semiconductor chip 15). The pressure contact type semiconductor apparatus of the present embodiment can continue to convert and control electric power, and has higher reliability.

The second connection member (35f, 35g) of the present embodiment includes the fourth elastic portion (38f, 38g) that can expand and contract in pressing direction 55 of pressing portion 6. The fourth elastic portion (38f, 38g) can absorb some of the energy of the fragments of second semiconductor chip 15. The fourth elastic portion (38f, 38g) can prevent the fragments of second semiconductor chip 15 from colliding with the second connection member (35f, 35g) to cause damage to the second connection member (35f, 35g). The fragments of second semiconductor chip 15 are more reliably prevented from causing damage to first semiconductor chip 10 and the package that houses first semiconductor chip 10 and second semiconductor chip 15. The pressure contact type semiconductor apparatus of the present embodiment can continue to convert and control electric power, and has higher reliability.

The fourth elastic portion (38f, 38g) is located above second intermediate electrode 25. The fourth elastic portion (38f, 38g) can compensate for the difference between the height of first semiconductor chip 10 and first intermediate electrode 20b and the height of second semiconductor chip 15 and second intermediate electrode 25. In this manner, the fourth elastic portion (38f, 38g) allows the application of uniform pressure to the plurality of semiconductor chips (first semiconductor chip 10 and second semiconductor chip 15) by first common electrode plate 40 and second common electrode plate 45. The fourth elastic portion (38f, 38g) can prevent the application of high pressure to a portion of the plurality of semiconductor chips (first semiconductor chip 10 and second semiconductor chip 15) to cause damage to the portion of the plurality of semiconductor chips (first semiconductor chip 10 and second semiconductor chip 15). The pressure contact type semiconductor apparatus of the present embodiment can continue to convert and control electric power, and has higher reliability.

In a pressure contact type semiconductor apparatus of a first variation of the present embodiment, second connection member 35 in pressure contact type semiconductor apparatus 1 of the first embodiment may be replaced by the second connection member (35f, 35g) of the present embodiment. In a pressure contact type semiconductor apparatus of a second variation of the present embodiment, second connection member 35 in pressure contact type semiconductor apparatus 1a of the second embodiment may be replaced by the second connection member (35f, 35g) of the present embodiment. In a third variation of the present embodiment, only first connection member 30 in pressure contact type semiconductor apparatus 1b of the third embodiment may be replaced by the first connection member (30f, 30g) of the present embodiment. In a fourth variation of the present embodiment, only second connection member 35 in pressure contact type semiconductor apparatus 1b of the third embodiment may be replaced by the second connection member (35f, 35g) of the present embodiment.

Eighth Embodiment

Figure 23:
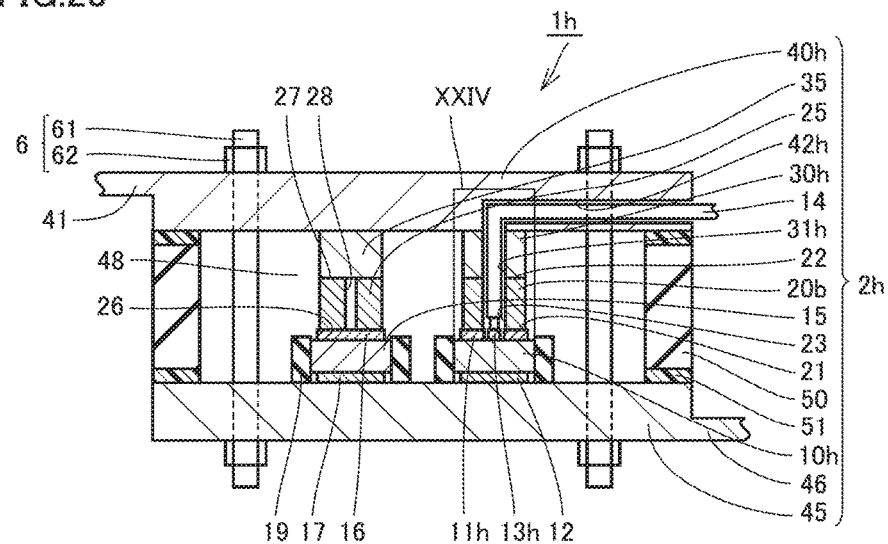
FIG. 23 is a schematic cross-sectional view of a pressure contact type semiconductor apparatus according to an eighth embodiment of the present disclosure.
Figure 24:
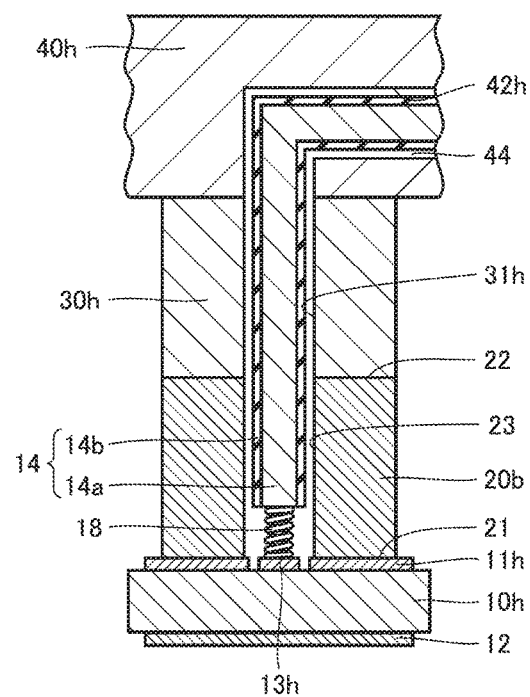
FIG. 24 is a schematic partial enlarged cross-sectional view of a region XXIV shown in FIG. 23 of the pressure contact type semiconductor apparatus according to the eighth embodiment of the present disclosure.

With reference to FIGS. 23 and 24, a pressure contact type semiconductor apparatus 1h according to an eighth embodiment is described. Pressure contact type semiconductor apparatus 1h of the present embodiment basically has a similar configuration to that of pressure contact type semiconductor apparatus 1b of the third embodiment, but mainly differs in the following respects.

One or more first through holes 23 of the present embodiment are communicated with the outside of a pressure contact type semiconductor device 2h. More particularly, pressure contact type semiconductor apparatus 1h of the present embodiment includes pressure contact type semiconductor device 2h. Pressure contact type semiconductor device 2h includes a first connection member 30h. First connection member 30h has a third through hole 31h communicated with one or more first through holes 23. A first common electrode plate 40h has a fourth through hole 42h communicated with third through hole 31h and the outside of pressure contact type semiconductor device 2h. One or more first through holes 23, third through hole 31h and fourth through hole 42h are fluidly separated from space 48. One or more first through holes 23, third through hole 31h and fourth through hole 42h are not communicated with space 48.

Pressure contact type semiconductor device 2h includes a first semiconductor chip 10h. In first semiconductor chip 10h of the present embodiment, a first electrode 11h is disposed around a third electrode 13h. First electrode 11h may be disposed around third electrode 13h so as to surround third electrode 13h. Third electrode 13h is disposed on the inner side of first electrode 11h. Third electrode 13h is located on the inner side of one or more first through holes 23.

Pressure contact type semiconductor device 2h of the present embodiment further includes third terminal 14 electrically connected to third electrode 13h. Third terminal 14 has a conductor 14a and an insulating layer 14b around conductor 14a. Current or voltage is supplied through conductor 14a to third electrode 13h of first semiconductor chip 10h from the outside of pressure contact type semiconductor apparatus 1h. Insulating layer 14b electrically insulates conductor 14a from first intermediate electrode 20b, first connection member 30h and first common electrode plate 40h. Third terminal 14 is routed through one or more first through holes 23, third through hole 31h and fourth through hole 42h to the outside of pressure contact type semiconductor device 2h. Third terminal 14 is disposed within one or more first through holes 23, third through hole 31h and fourth through hole 42h, with a gap 44 communicated with the outside and provided between one or more first through holes 23, third through hole 31h and fourth through hole 42h, and third terminal 14.

The effect of pressure contact type semiconductor apparatus 1h of the present embodiment will be described. Pressure contact type semiconductor apparatus 1h of the present embodiment produces a similar effect to that of pressure contact type semiconductor apparatus 1b of the third embodiment, but differs in the following respects.

One or more first through holes 23 of the present embodiment are communicated with the outside of pressure contact type semiconductor device 2h. One or more first through holes 23 are fluidly separated from space 48 hermetically sealed by cylindrical body 50, first common electrode plate 40 and second common electrode plate 45. Thus, even if a region of first semiconductor chip 10h that corresponds to one or more first through holes 23 is damaged, fragments of first semiconductor chip 10h are prevented from causing damage to second semiconductor chip 15 and the package that houses first semiconductor chip 10h and second semiconductor chip 15. Pressure contact type semiconductor apparatus 1h of the present embodiment can continue to convert and control electric power, and has high reliability.

Heat generated at first semiconductor chip 10h during operation of pressure contact type semiconductor apparatus 1h causes expansion of fluid such as the air in one or more first through holes 23. Since one or more first through holes 23 are communicated with the outside of pressure contact type semiconductor apparatus 1h, the thermally expanded fluid can be discharged to the outside of pressure contact type semiconductor apparatus 1h. According to pressure contact type semiconductor apparatus 1h of the present embodiment, the thermally expanded fluid is prevented from causing damage to pressure contact type semiconductor apparatus 1h. Pressure contact type semiconductor apparatus 1h of the present embodiment can continue to convert and control electric power, and has high reliability.

First connection member 30h of the present embodiment has third through hole 31h communicated with one or more first through holes 23. First common electrode plate 40h has fourth through hole 42h communicated with third through hole 31h and the outside of pressure contact type semiconductor device 2h. One or more first through holes 23, third through hole 31h and fourth through hole 42h are fluidly separated from space 48 hermetically sealed by cylindrical body 50, first common electrode plate 40 and second common electrode plate 45. Thus, even if the region of first semiconductor chip 10h that corresponds to one or more first through holes 23 is damaged, the fragments of first semiconductor chip 10h are discharged through one or more first through holes 23, third through hole 31h and fourth through hole 42h to the outside of pressure contact type semiconductor device 2h. The fragments of first semiconductor chip 10h are prevented from causing damage to second semiconductor chip 15 and the package that houses first semiconductor chip 10h and second semiconductor chip 15. Pressure contact type semiconductor apparatus 1h of the present embodiment can continue to convert and control electric power, and has high reliability.

The fluid such as the air in one or more first through holes 23, which has expanded due to the heat generated at first semiconductor chip 10h during operation of pressure contact type semiconductor apparatus 1h, can be discharged through one or more first through holes 23, third through hole 31h and fourth through hole 42h to the outside of pressure contact type semiconductor apparatus 1h. According to pressure contact type semiconductor apparatus 1h of the present embodiment, the thermally expanded fluid is prevented from causing damage to pressure contact type semiconductor apparatus $1h$. Pressure contact type semiconductor apparatus $1h$ of the present embodiment can continue to convert and control electric power, and has high reliability.

Pressure contact type semiconductor device $2h$ of the present embodiment further includes the terminal (third terminal 14) electrically connected to third electrode $13h$. Third electrode $13h$ is located on the inner side of one or more first through holes 23. First electrode $11h$ is disposed around third electrode $13h$ so as to surround third electrode $13h$. The terminal (third terminal 14) is routed through one or more first through holes 23, third through hole $31h$ and fourth through hole $42h$ to the outside of pressure contact type semiconductor device $2h$. The terminal (third terminal 14) is disposed within one or more first through holes 23, third through hole $31h$ and fourth through hole $42h$, with gap 44 communicated with the outside of pressure contact type semiconductor device $2h$ and provided between one or more first through holes 23, third through hole $31h$ and fourth through hole $42h$, and the terminal (third terminal 14). Thus, even if the region of first semiconductor chip $10h$ that corresponds to one or more first through holes 23 is damaged, the fragments of first semiconductor chip $10h$ are discharged through gap 44 to the outside of pressure contact type semiconductor device $2h$. The fragments of first semiconductor chip $10h$ are prevented from causing damage to second semiconductor chip 15 and the package that houses first semiconductor chip $10h$ and second semiconductor chip 15. Pressure contact type semiconductor apparatus $1h$ of the present embodiment can continue to convert and control electric power, and has high reliability.

The fluid such as the air in one or more first through holes 23, which has expanded due to the heat generated at first semiconductor chip $10h$ during operation of pressure contact type semiconductor apparatus $1h$, can be discharged through gap 44 to the outside of pressure contact type semiconductor apparatus $1h$. According to pressure contact type semiconductor apparatus $1h$ of the present embodiment, the thermally expanded fluid is prevented from causing damage to pressure contact type semiconductor apparatus $1h$. Pressure contact type semiconductor apparatus $1h$ of the present embodiment can continue to convert and control electric power, and has high reliability.

In the present embodiment, first electrode $11h$ is disposed around third electrode $13h$ so as to surround third electrode $13h$. First intermediate electrode $20b$ on first electrode $11h$ can be disposed in a uniform manner on the surface of first semiconductor chip $10h$. First semiconductor chip $10h$ can be uniformly pressed by first intermediate electrode $20b$. According to pressure contact type semiconductor apparatus $1h$ of the present embodiment, variation in electrical characteristics of first semiconductor chip $10h$ and cracking of first semiconductor chip $10h$, which may be caused by first semiconductor chip $10h$ being nonuniformly pressed by first intermediate electrode $20b$, can be suppressed. Pressure contact type semiconductor apparatus $1h$ of the present embodiment has high reliability. Further, in pressure contact type semiconductor apparatus $1h$ of the present embodiment, since first intermediate electrode $20b$ can be disposed in a uniform manner on the surface of first semiconductor chip $10h$, first intermediate electrode $20b$ on first electrode $11h$ can uniformly cool first semiconductor chip $10h$. Pressure contact type semiconductor apparatus $1h$ of the present embodiment can continue to convert and control electric power, and has high reliability.

In the present embodiment, third electrode $13h$ is located on the inner side of one or more first through holes 23. The terminal (third terminal 14) is housed within one or more first through holes 23, third through hole $31h$ and fourth through hole $42h$. Accordingly, the terminal (third terminal 14) electrically connected to third electrode $13h$ located on the inner side of one or more first through holes 23 can be routed to the outside of pressure contact type semiconductor apparatus $1h$. In addition, one or more first through holes 23, third through hole $31h$ and fourth through hole $42h$ can allow the terminal (third terminal 14) to be positioned with high accuracy relative to third electrode $13h$ located on the inner side of one or more first through holes 23. The terminal (third terminal 14) can serve as guide 19 to align first common electrode plate $40h$ and first connection member $30h$ relative to first intermediate electrode $20b$. Thus, the accuracy of alignment of first common electrode plate $40h$ and first connection member $30h$ relative to first intermediate electrode $20b$ can be improved. Further, the terminal (third terminal 14) is housed within one or more first through holes 23, third through hole $31h$ and fourth through hole $42h$. Thus, even if pressure contact type semiconductor device $2h$ is pressed by pressing portion 6, the application of high pressure to the terminal (third terminal 14) can be prevented. According to pressure contact type semiconductor apparatus $1h$ of the present embodiment, disconnection of the terminal (third terminal 14) can be suppressed. Pressure contact type semiconductor apparatus $1h$ of the present embodiment can continue to convert and control electric power, and has high reliability.

Ninth Embodiment

Figure 25:
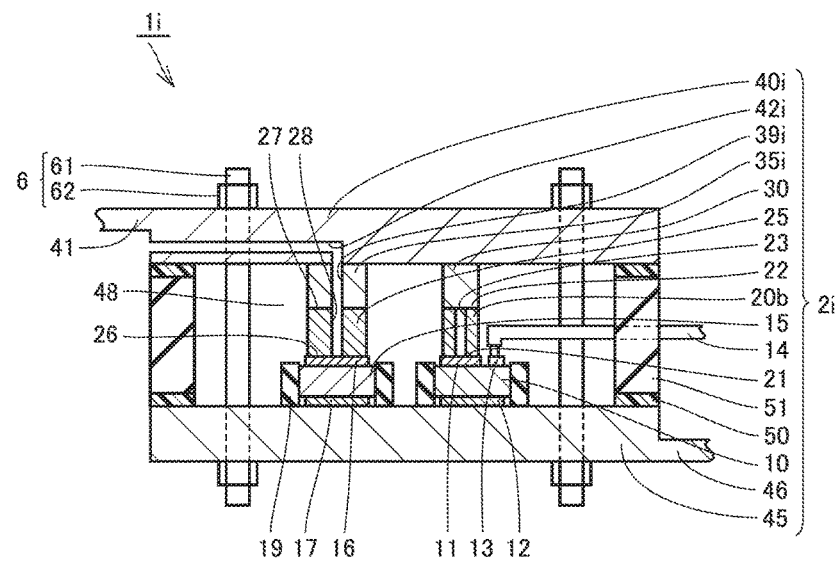
FIG. 25 is a schematic cross-sectional view of a pressure contact type semiconductor apparatus according to a ninth embodiment of the present disclosure.

With reference to FIG. 25, a pressure contact type semiconductor apparatus $1i$ according to a ninth embodiment is described. Pressure contact type semiconductor apparatus $1i$ of the present embodiment basically has a similar configuration to that of pressure contact type semiconductor apparatus $1b$ of the third embodiment, but mainly differs in the following respects.

One or more second through holes 28 of the present embodiment are communicated with the outside of a pressure contact type semiconductor device $2i$. More particularly, pressure contact type semiconductor apparatus $1i$ of the present embodiment includes pressure contact type semiconductor device $2i$. Pressure contact type semiconductor device $2i$ includes a second connection member $35i$. Second connection member $35i$ has a fifth through hole $39i$ communicated with one or more second through holes 28. A first common electrode plate $40i$ has a sixth through hole $42i$ communicated with fifth through hole $39i$ and the outside of pressure contact type semiconductor device $2i$. One or more second through holes 28, fifth through hole $39i$ and sixth through hole $42i$ are fluidly separated from space 48. One or more second through holes 28, fifth through hole $39i$ and sixth through hole $42i$ are not communicated with space 48.

The effect of pressure contact type semiconductor apparatus $1i$ of the present embodiment will be described. Pressure contact type semiconductor apparatus $1i$ of the present embodiment produces a similar effect to that of pressure contact type semiconductor apparatus $1b$ of the third embodiment, but differs in the following respects.

One or more second through holes 28 of the present embodiment are communicated with the outside of pressure contact type semiconductor device $2i$. One or more second through holes 28 are fluidly separated from space 48 hermetically sealed by cylindrical body 50, first common electrode plate 40i and second common electrode plate 45. Thus, even if the region of second semiconductor chip 15 that corresponds to one or more second through holes 28 is damaged, fragments of second semiconductor chip 15 are prevented from causing damage to first semiconductor chip 10 and the package that houses first semiconductor chip 10 and second semiconductor chip 15. Pressure contact type semiconductor apparatus 1i of the present embodiment can continue to convert and control electric power, and has high reliability.

Heat generated at second semiconductor chip 15 during operation of pressure contact type semiconductor apparatus 1i causes expansion of fluid such as the air in one or more second through holes 28. Since one or more second through holes 28 are communicated with the outside of pressure contact type semiconductor apparatus 1i, the thermally expanded fluid can be discharged to the outside of pressure contact type semiconductor apparatus 1i. According to pressure contact type semiconductor apparatus 1i of the present embodiment, the thermally expanded fluid is prevented from causing damage to pressure contact type semiconductor apparatus 1i. Pressure contact type semiconductor apparatus 1i of the present embodiment can continue to convert and control electric power, and has high reliability.

Second connection member 35i of the present embodiment has fifth through hole 39i communicated with one or more second through holes 28. First common electrode plate 40i has sixth through hole 42i communicated with fifth through hole 39i and the outside of pressure contact type semiconductor device 2i. One or more second through holes 28, fifth through hole 39i and sixth through hole 42i are fluidly separated from space 48 hermetically sealed by cylindrical body 50, first common electrode plate 40i and second common electrode plate 45. Thus, even if the region of second semiconductor chip 15 that corresponds to one or more second through holes 28 is damaged, the fragments of second semiconductor chip 15 are discharged through one or more second through holes 28, fifth through hole 39i and sixth through hole 42i to the outside of pressure contact type semiconductor device 2i. The fragments of second semiconductor chip 15 are prevented from causing damage to first semiconductor chip 10 and the package that houses first semiconductor chip 10 and second semiconductor chip 15. Pressure contact type semiconductor apparatus 1i of the present embodiment can continue to convert and control electric power, and has high reliability.

The fluid such as the air in one or more second through holes 28, which has expanded due to the heat generated at second semiconductor chip 15 during operation of pressure contact type semiconductor apparatus 1i, can be discharged through one or more second through holes 28, fifth through hole 39i and sixth through hole 42i to the outside of pressure contact type semiconductor apparatus 1i. According to pressure contact type semiconductor apparatus 1i of the present embodiment, the thermally expanded fluid is prevented from causing damage to pressure contact type semiconductor apparatus 1i. Pressure contact type semiconductor apparatus 1i of the present embodiment can continue to convert and control electric power, and has high reliability.

Figure 26:
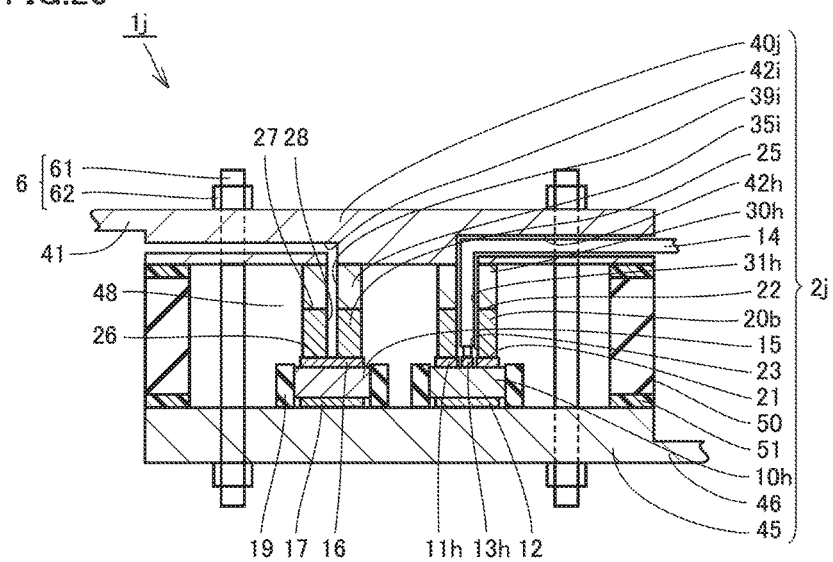
FIG. 26 is a schematic cross-sectional view of a pressure contact type semiconductor apparatus according to a variation of the ninth embodiment of the present disclosure.

With reference to FIG. 26, a pressure contact type semiconductor apparatus 1j of a variation of the present embodiment may include a pressure contact type semiconductor device 2j. More particularly, pressure contact type semiconductor apparatus 1j of the variation of the present embodiment may be such that second connection member 35i has fifth through hole 39i communicated with one or more second through holes 28, and a first common electrode plate 40j has sixth through hole 42i communicated with fifth through hole 39i and the outside of pressure contact type semiconductor device 2i, in pressure contact type semiconductor apparatus 1i of the eighth embodiment. Pressure contact type semiconductor apparatus 1j of the variation of the present embodiment substantially has the effect of pressure contact type semiconductor apparatus 1j of the present embodiment and the effect of pressure contact type semiconductor apparatus 1h of the eighth embodiment.

Tenth Embodiment

Figure 27:
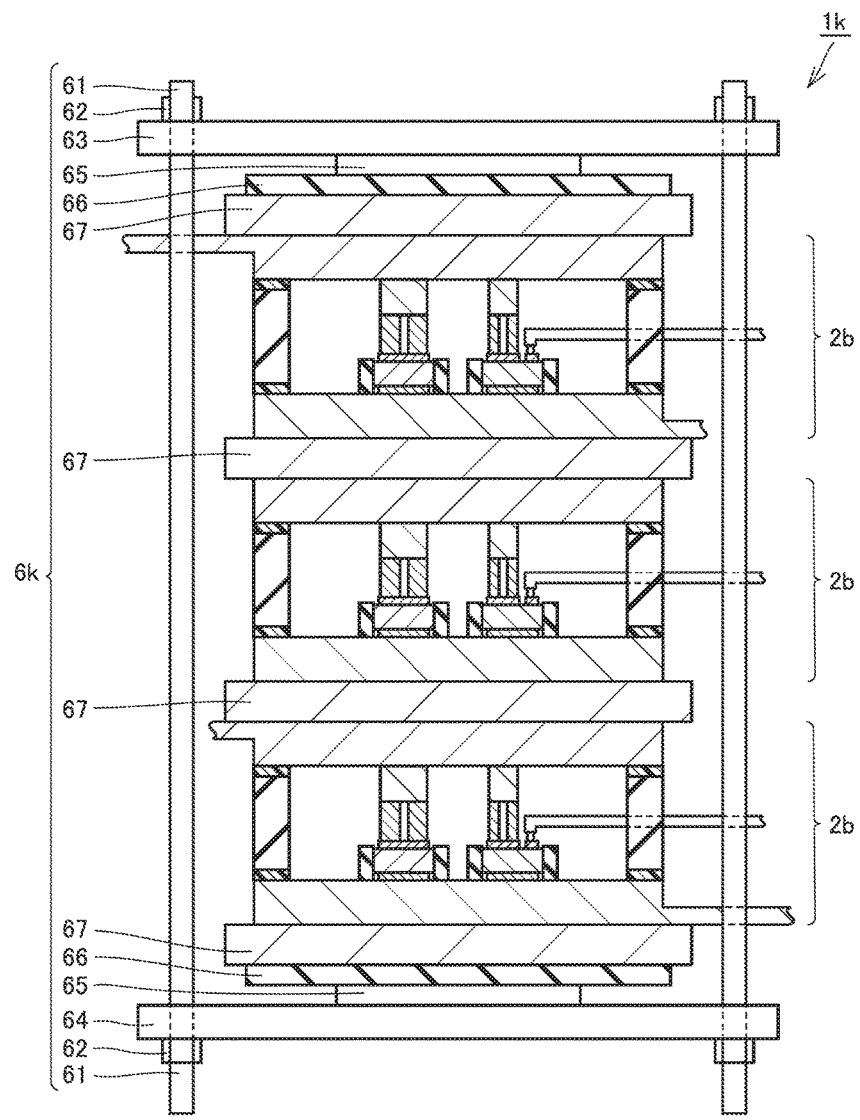
FIG. 27 is a schematic cross-sectional view of a pressure contact type semiconductor apparatus according to a tenth embodiment of the present disclosure.

With reference to FIG. 27, a pressure contact type semiconductor apparatus 1k of a tenth embodiment is described. Pressure contact type semiconductor apparatus 1k of the present embodiment basically has a similar configuration to that of pressure contact type semiconductor apparatus 1b of the third embodiment, but mainly differs in the following respects.

In pressure contact type semiconductor apparatus 1k of the present embodiment, a plurality of pressure contact type semiconductor devices 2b are stacked within a pressing portion 6k. Specifically, the plurality of pressure contact type semiconductor devices 2b are stacked between a first plate 63 and a second plate 64 of pressing portion 6k. The plurality of stacked pressure contact type semiconductor devices 2b are electrically connected in series with one another. Specifically, at least one conductive plate 67 is disposed between the plurality of pressure contact type semiconductor devices 2b. More particularly, the plurality of pressure contact type semiconductor devices 2b and a plurality of conductive plates 67 are alternately stacked. The plurality of pressure contact type semiconductor devices 2b are electrically connected in series with one another with the plurality of conductive plates 67 interposed therebetween. Conductive plate 67 may serve as a heat sink that dissipates heat generated at first semiconductor chip 10 and second semiconductor chip 15 to the outside of pressure contact type semiconductor apparatus 1k. Conductive plate 67 may be a metal plate, for example. Conductive plate 67 may have a fin so as to improve cooling efficiency by conductive plate 67.

First terminal 41 is provided on first common electrode plate 40 of one of the plurality of pressure contact type semiconductor devices 2b that is closest to first plate 63. Second terminal 46 is provided on second common electrode plate 45 of one of the plurality of pressure contact type semiconductor devices 2b that is closest to second plate 64.

Pressing portion 6k presses the plurality of stacked pressure contact type semiconductor devices 2b. Specifically, pressing portion 6k may further include first plate 63, second plate 64, a second elastic member 65 and an insulating plate 66. Second elastic member 65 is disposed between first plate 63 and conductive plate 67, and between second plate 64 and conductive plate 67. Second elastic member 65 may be a disc spring or a leaf spring. Second elastic member 65 can allow first semiconductor chip 10 and second semiconductor chip 15 to be pressed with uniform force. Insulating plate 66 is disposed between conductive plate 67 and second elastic member 65 in order to electrically insulate conductive plate 67 and second elastic member 65 from each other.

Pressing portion 6k presses first plate 63 and second plate 64 toward first semiconductor chip 10 and second semiconductor chip 15. For example, nut 62 is tightened on the bolt of rod 61 to press first plate 63 and second plate 64 toward first semiconductor chip 10 and second semiconductor chip 15. In this manner, first common electrode plate 40 and second common electrode plate 45 are electrically connected to first semiconductor chip 10 and second semiconductor chip 15, and the plurality of stacked pressure contact type semiconductor devices 2b are electrically connected in series with one another. Pressing portion 6 may include other pressing means.

The effect of pressure contact type semiconductor apparatus 1k of the present embodiment will be described. In addition to the effect of pressure contact type semiconductor apparatus 1b of the third embodiment, pressure contact type semiconductor apparatus 1k of the present embodiment produces the following effect.

In pressure contact type semiconductor apparatus 1k of the present embodiment, the plurality of pressure contact type semiconductor devices 2b are stacked within pressing portion 6k, where the plurality of stacked pressure contact type semiconductor devices 2b are electrically connected in series with one another. When first semiconductor chip 10 in one of the plurality of pressure contact type semiconductor devices 2b is shorted, the one of the plurality of pressure contact type semiconductor devices 2b is shorted, but the other plurality of pressure contact type semiconductor devices 2b can operate normally. Even if first semiconductor chip 10 in one of the plurality of pressure contact type semiconductor devices 2b is shorted, pressure contact type semiconductor apparatus 1k of the present embodiment can continue to convert and control electric power. Pressure contact type semiconductor apparatus 1k of the present embodiment has high reliability and good redundancy.

In pressure contact type semiconductor apparatus 1k of the present embodiment, the plurality of stacked pressure contact type semiconductor devices 2b are electrically connected in series with one another. Thus, a high voltage can be applied between first terminal 41 and second terminal 46 of pressure contact type semiconductor apparatus 1k. Pressure contact type semiconductor apparatus 1k of the present embodiment has a higher breakdown voltage (applicable voltage) than that of pressure contact type semiconductor apparatus 1b of the third embodiment.

Pressure contact type semiconductor apparatus 1k of the present embodiment may further include at least one conductive plate 67 serving as a heat sink between the plurality of pressure contact type semiconductor devices 2b. At least one conductive plate 67 serving as a heat sink can efficiently dissipate heat generated at first semiconductor chip 10 and second semiconductor chip 15 to the outside of pressure contact type semiconductor apparatus 1k.

In a pressure contact type semiconductor apparatus of a variation of the present embodiment, the plurality of stacked pressure contact type semiconductor devices 2b may be any one of the pressure contact type semiconductor devices of the first embodiment to the ninth embodiment and their variations, for example.

It should be understood that the embodiments and their variations disclosed herein are illustrative and non-restrictive in every respect. At least two of the first embodiment to the tenth embodiment and their variations disclosed herein can be combined together as long as there is no inconsistency. The scope of the present disclosure is defined by the terms of the claims, rather than the description above, and is intended to include any modifications within the scope and meaning equivalent to the terms of the claims.

REFERENCE SIGNS LIST 1, 1a, 1b, 1h, 1i, 1j, 1k pressure contact type semiconductor apparatus; 2, 2a, 2b, 2h, 2i, 2j pressure contact type semiconductor device; 6, 6k pressing portion; 10, 10h first semiconductor chip; 11, 11h first electrode; 12 second electrode; 13, 13h third electrode; 14 third terminal; 14a conductor; 14b insulating layer; 15 second semiconductor chip; 16 fourth electrode; 17 fifth electrode; 18, 18a first elastic member; 19 guide; 20, 20b, 20c first intermediate electrode; 21 first surface; 22 second surface; 23, 23c first through hole; 25, 25c second intermediate electrode; 26 third surface; 27 fourth surface; 28, 28c second through hole; 30, 30d, 30e, 30f, 30g, 30h first connection member; 31d first projecting portion; 31e first elastic portion; 31h third through hole; 32a, 32b first frame; 33f, 33g third elastic portion; 35, 35d, 35e, 35f, 35g, 35i second connection member; 36d second projecting portion; 36e second elastic portion; 37a, 37b second frame; 38f, 38g fourth elastic portion; 39i fifth through hole; 40, 40h, 40i, 40j first common electrode plate; 41 first terminal; 42h fourth through hole; 42i sixth through hole; 44 gap; 45 second common electrode plate; 46 second terminal; 48 space; 50 cylindrical body; 51 sealing member; 53c normal of first electrode; 54, 54c direction along which first through hole extends; 55 pressing direction; 58c normal of second electrode; 59, 59c direction along which second through hole extends; 61 rod; 62 nut; 63 first plate; 64 second plate; 65 second elastic member; 66 insulating plate; 67 conductive plate.

The invention claimed is:

1. A pressure contact type semiconductor apparatus comprising:
 a pressure contact type semiconductor device; and
 a pressing portion that presses the pressure contact type semiconductor device,
 the pressure contact type semiconductor device including
  a first semiconductor chip with three terminals having a first electrode, a second electrode and a third electrode,
  a second semiconductor chip with two terminals having a fourth electrode and a fifth electrode,
  a first intermediate electrode on the first electrode of the first semiconductor chip,
  a second intermediate electrode on the fourth electrode of the second semiconductor chip,
  a first common electrode plate and a second common electrode plate sandwiching the first semiconductor chip, the second semiconductor chip, the first intermediate electrode and the second intermediate electrode therebetween, and
  a cylindrical body mechanically connected to the first common electrode plate and the second common electrode plate,
 the cylindrical body, the first common electrode plate and the second common electrode plate hermetically sealing the first semiconductor chip, the second semiconductor chip, the first intermediate electrode and the second intermediate electrode,
 the first common electrode plate and the second common electrode plate being pressed by the pressing portion toward the first semiconductor chip and the second semiconductor chip to be electrically connected to the first semiconductor chip and the second semiconductor chip,
 the second semiconductor chip being electrically connected in parallel to the first semiconductor chip,
 the first intermediate electrode having a first surface facing the first electrode of the first semiconductor chip and a second surface opposite to the first surface,
 the second intermediate electrode having a third surface facing the fourth electrode of the second semiconductor chip and a fourth surface opposite to the third surface, the second intermediate electrode having one or more second through holes extending between the third surface and the fourth surface, the one or more second through holes being fluidly separated from a space hermetically sealed by the cylindrical body, the first common electrode plate and the second common electrode plate.

2. The pressure contact type semiconductor apparatus according to claim 1, wherein a direction along which the one or more second through holes extend is inclined relative to a normal of the fourth electrode.

3. The pressure contact type semiconductor apparatus according to claim 1, wherein the pressure contact type semiconductor device further includes a second connection member between the second intermediate electrode and the first common electrode plate, and the second connection member and the second semiconductor chip close the one or more second through holes.

4. The pressure contact type semiconductor apparatus according to claim 3, wherein the second connection member has a second projecting portion inserted into at least one of the one or more second through holes.

5. The pressure contact type semiconductor apparatus according to claim 3, wherein the second connection member has a second elastic portion inserted into at least one of the one or more second through holes, and the second elastic portion is capable of expanding and contracting in a direction along which the at least one of the one or more second through holes extends.

6. The pressure contact type semiconductor apparatus according to claim 3, wherein the second connection member includes a fourth elastic portion capable of expanding and contracting in a pressing direction of the pressing portion, and the fourth elastic portion is located above the second intermediate electrode.

7. The pressure contact type semiconductor apparatus according to claim 1, wherein the one or more second through holes are communicated with outside of the pressure contact type semiconductor device.

8. The pressure contact type semiconductor apparatus according to claim 7, wherein the pressure contact type semiconductor device further includes a second connection member between the second intermediate electrode and the first common electrode plate, the second connection member has a fifth through hole communicated with the one or more second through holes, the first common electrode plate has a sixth through hole communicated with the fifth through hole and the outside of the pressure contact type semiconductor device, and the one or more second through holes, the fifth through hole and the sixth through hole are fluidly separated from the space.

9. The pressure contact type semiconductor apparatus according to claim 1, wherein the first intermediate electrode has one or more first through holes extending between the first surface and the second surface, and the one or more first through holes are fluidly separated from the space hermetically sealed by the cylindrical body, the first common electrode plate and the second common electrode plate.

10. The pressure contact type semiconductor apparatus according to claim 9, wherein a direction along which the one or more first through holes extend is inclined relative to a normal of the first electrode.

11. The pressure contact type semiconductor apparatus according to claim 9, wherein the third electrode is disposed on an outer side of the first intermediate electrode and the one or more first through holes.

12. The pressure contact type semiconductor apparatus according to claim 9, wherein the pressure contact type semiconductor device further includes a first connection member between the first intermediate electrode and the first common electrode plate, and the first connection member and the first semiconductor chip close the one or more first through holes.

13. The pressure contact type semiconductor apparatus according to claim 12, wherein the first connection member has a first projecting portion inserted into at least one of the one or more first through holes.

14. The pressure contact type semiconductor apparatus according to claim 12, wherein the first connection member has a first elastic portion inserted into at least one of the one or more first through holes, and the first elastic portion is capable of expanding and contracting in a direction along which the at least one of the one or more first through holes extends.

15. The pressure contact type semiconductor apparatus according to claim 12, wherein the first connection member includes a third elastic portion capable of expanding and contracting in a pressing direction of the pressing portion, and the third elastic portion is located above the first intermediate electrode.

16. The pressure contact type semiconductor apparatus according to claim 9, wherein the one or more first through holes are communicated with outside of the pressure contact type semiconductor device.

17. The pressure contact type semiconductor apparatus according to claim 16, wherein the pressure contact type semiconductor device further includes a first connection member between the first intermediate electrode and the first common electrode plate, the first connection member has a third through hole communicated with the one or more first through holes, the first common electrode plate has a fourth through hole communicated with the third through hole and the outside of the pressure contact type semiconductor device, and the one or more first through holes, the third through hole and the fourth through hole are fluidly separated from the space.

18. The pressure contact type semiconductor apparatus according to claim 17, wherein the pressure contact type semiconductor device further includes a terminal electrically connected to the third electrode, the third electrode is located on an inner side of the one or more first through holes, the first electrode is disposed around the third electrode so as to surround the third electrode, the terminal is routed through the one or more first through holes, the third through hole and the fourth through hole to the outside of the pressure contact type semiconductor device, and the terminal is disposed within the one or more first through holes, the third through hole and the fourth through hole, with a gap communicated with the outside and provided between the one or more first through holes, the third through hole and the fourth through hole and the terminal.

19. The pressure contact type semiconductor apparatus according to claim 1, wherein a plurality of the pressure contact type semiconductor devices are stacked within the pressing portion, the plurality of stacked pressure contact type semiconductor devices are electrically connected in series with one another, and the pressing portion presses the plurality of stacked pressure contact type semiconductor devices.

* * * * *